US011309041B2

(12) United States Patent
Li et al.

(10) Patent No.: US 11,309,041 B2
(45) Date of Patent: Apr. 19, 2022

(54) SMART ERASE VERIFY TEST TO DETECT SLOW-ERASING BLOCKS OF MEMORY CELLS

(71) Applicant: Western Digital Technologies, Inc., San Jose, CA (US)

(72) Inventors: Liang Li, Shanghai (CN); Ming Wang, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 183 days.

(21) Appl. No.: 16/837,313

(22) Filed: Apr. 1, 2020

(65) Prior Publication Data
US 2021/0304830 A1 Sep. 30, 2021

(30) Foreign Application Priority Data
Mar. 24, 2020 (CN) .......................... 202010228197.X

(51) Int. Cl.
G11C 16/34 (2006.01)
G06F 3/06 (2006.01)

(52) U.S. Cl.
CPC .......... G11C 16/3445 (2013.01); G06F 3/064 (2013.01); G06F 3/0607 (2013.01); G06F 3/0611 (2013.01); G06F 3/0652 (2013.01); G06F 3/0688 (2013.01)

(58) Field of Classification Search
CPC ...... G06F 3/0607; G06F 3/0611; G06F 3/064; G06F 3/0652; G06F 3/0688; G11C 16/3445; G11C 29/50004; G11C 2029/0409; G11C 11/5635; G11C 11/5671; G11C 16/14; G11C 16/0483

USPC ..................................................... 365/185.22
See application file for complete search history.

(56) References Cited

U.S. PATENT DOCUMENTS

| 7,430,138 B2 | 9/2008 | Higashitani |
| 7,808,829 B2 | 10/2010 | Lee |
| 8,130,551 B2 | 3/2012 | Oowada et al. |
| 9,047,970 B2 | 6/2015 | Wan et al. |
| 9,236,139 B1 | 1/2016 | Lai et al. |
| 9,343,160 B1 | 5/2016 | Dutta et al. |
| 9,349,480 B2 | 5/2016 | Ferragina et al. |
| 9,449,698 B1 | 9/2016 | Paudel et al. |
| 2006/0083073 A1 | 4/2006 | Ueda |

(Continued)

OTHER PUBLICATIONS

International Search Report & The Written Opinion of the International Searching Authority dated Sep. 10, 2020, International Application No. PCT/US2020/035023.

Primary Examiner — Fernando Hidalgo
(74) Attorney, Agent, or Firm — Vierra Magen Marcus LLP

(57) ABSTRACT

Apparatuses and techniques are described for determining if a block of memory cells is slow-erasing during an erase operation for the block. An erase operation performs an additional verify test in a specified erase-verify iteration to check the position of the upper tail of the threshold voltage distribution of the memory cells of a block. If the upper tail is too high, this indicates a slow-erasing block, even if the erase operation is successfully completed within an allowable number of erase-verify iterations. The additional verify test can be initiated using a prefix command which is transmitted with an erase command to the memory chip. Or, it can be initiated by a device parameter on the memory chip.

20 Claims, 20 Drawing Sheets

(56) References Cited

U.S. PATENT DOCUMENTS

| | | |
|---|---|---|
| 2008/0137409 A1 | 6/2008 | Nakamura et al. |
| 2008/0158994 A1* | 7/2008 | Yang .................. G11C 16/0483 365/185.22 |
| 2013/0163336 A1 | 6/2013 | Li et al. |
| 2013/0163337 A1 | 6/2013 | Li et al. |
| 2020/0265897 A1* | 8/2020 | Lu ..................... G11C 16/3472 |

* cited by examiner

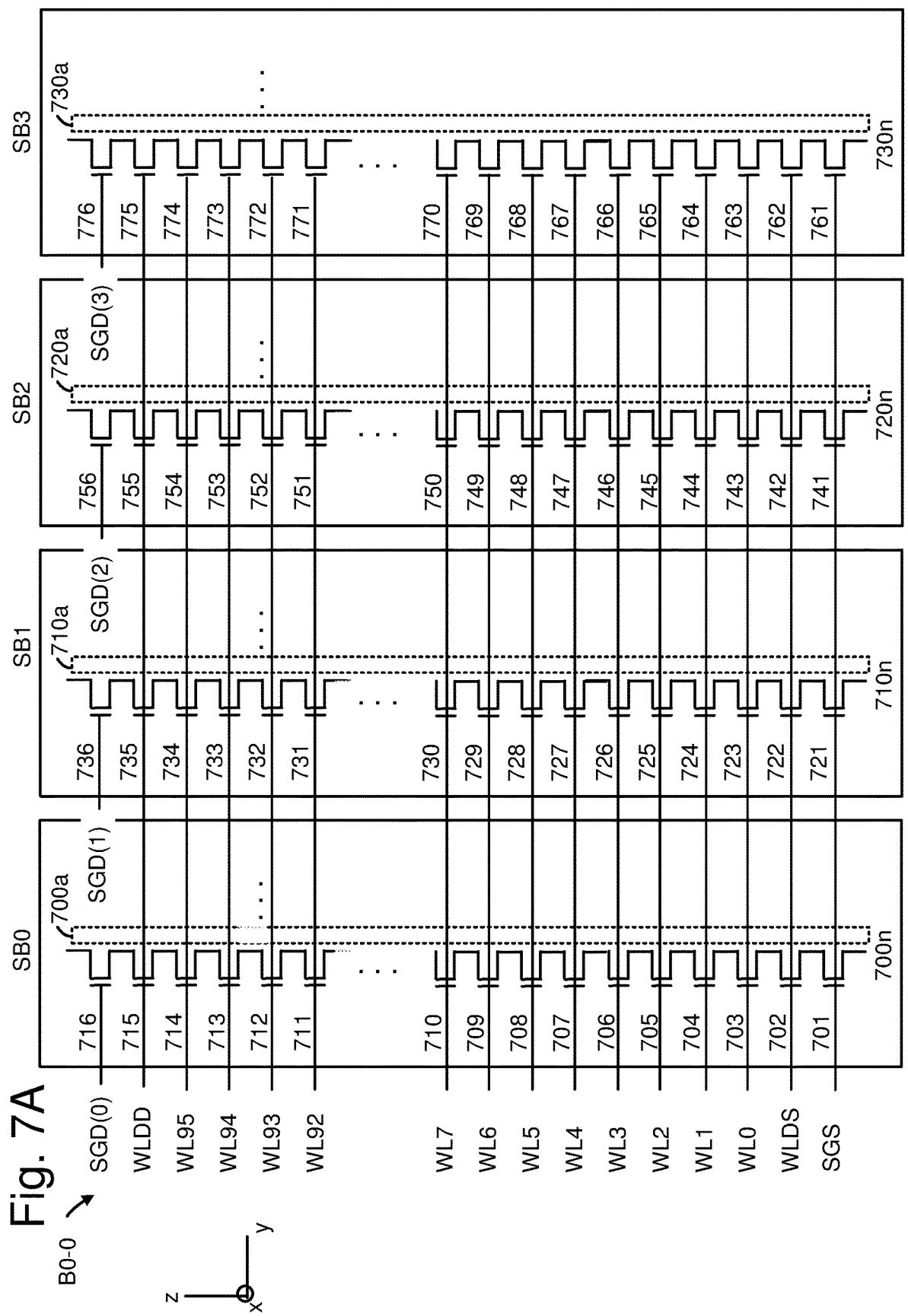

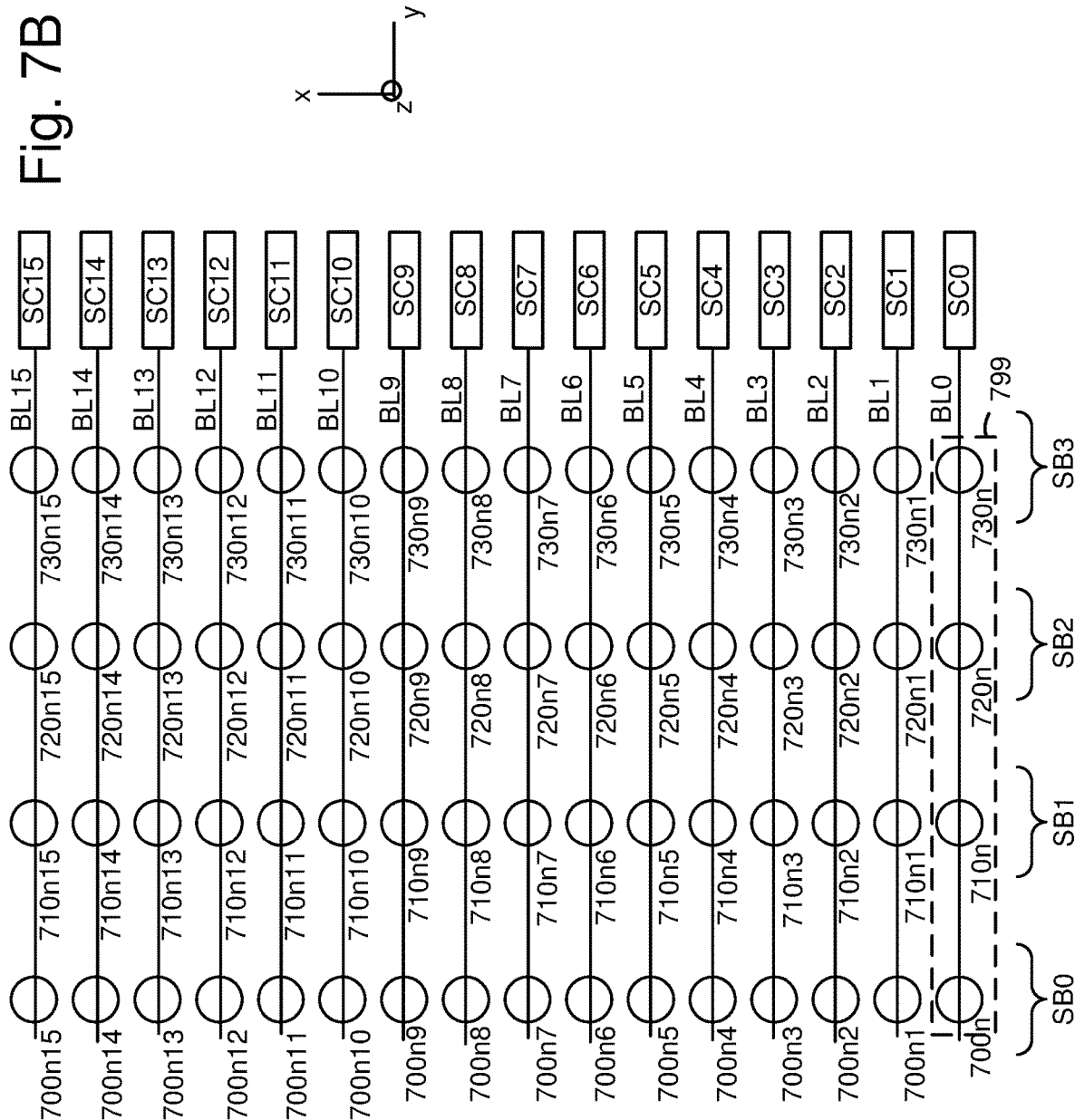

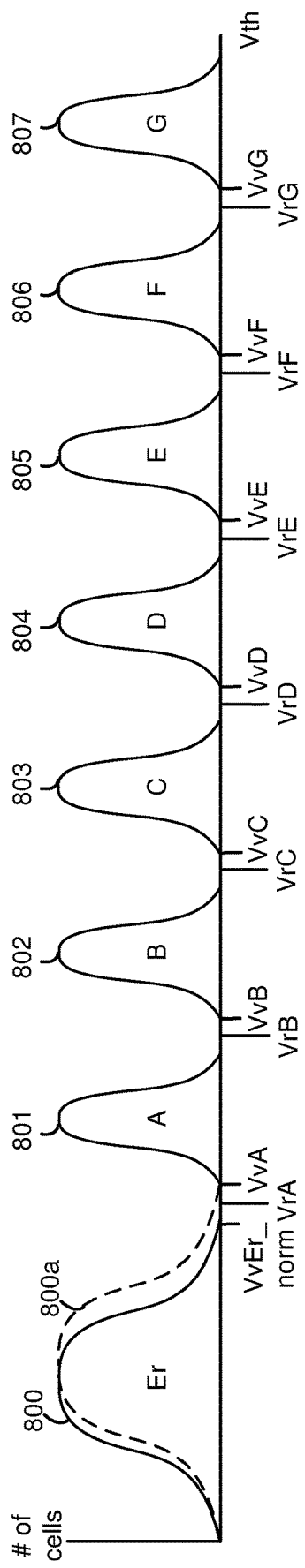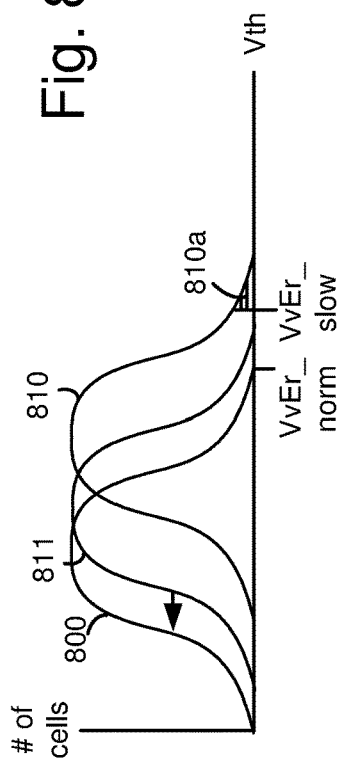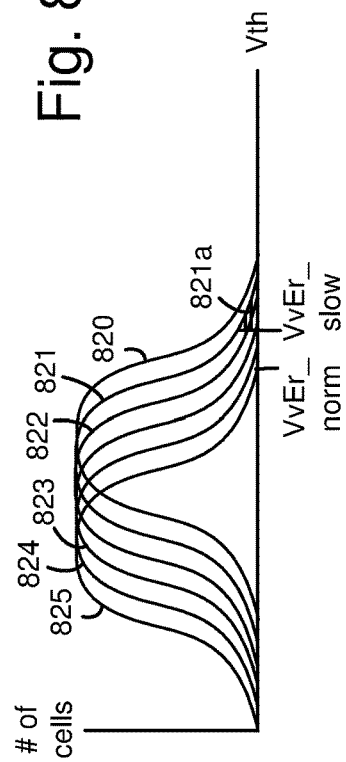

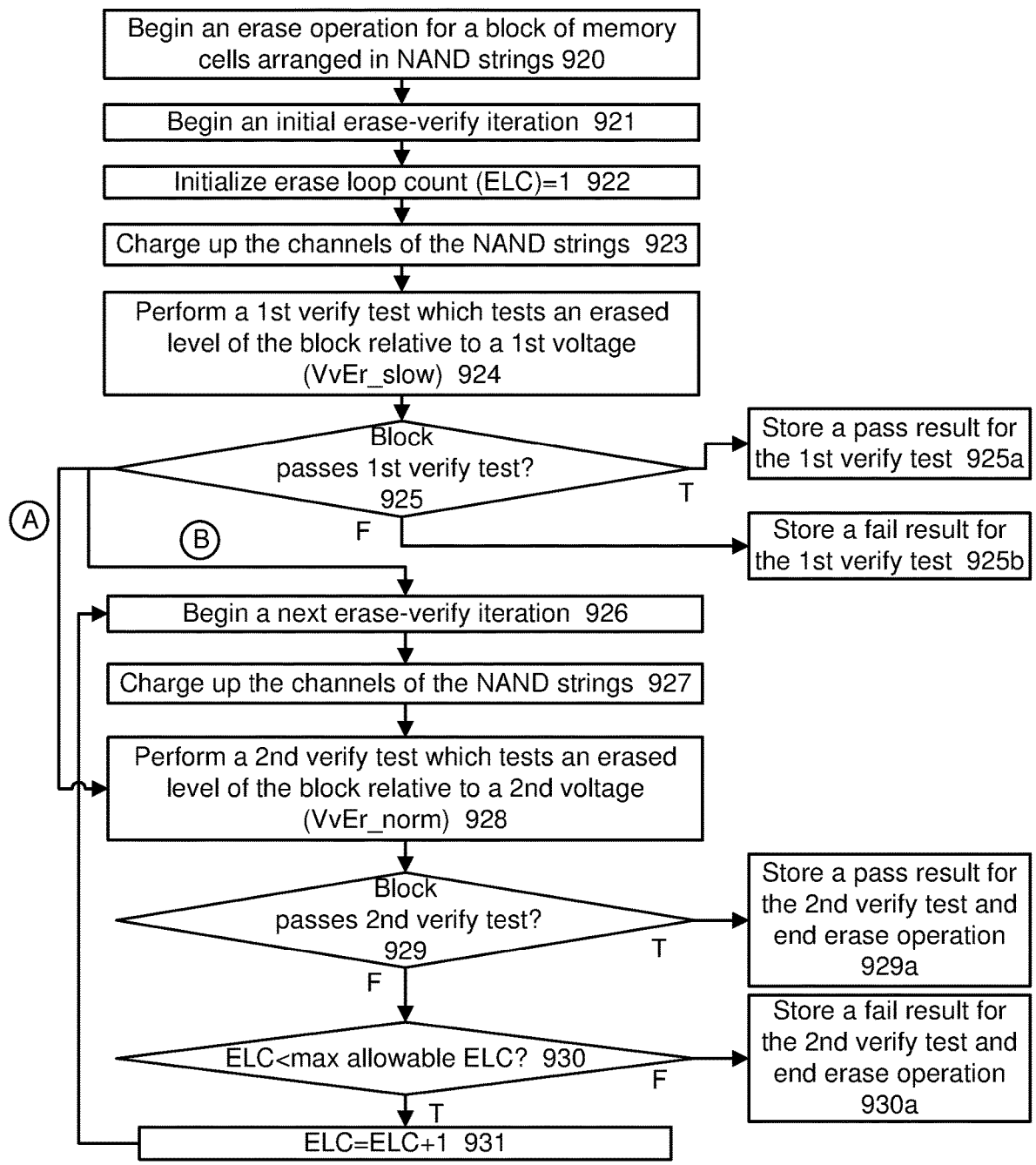

Fig. 10

| Command | IO7 | IO6 | IO5 | IO4 | IO3 | IO2 | IO1 | IO0 |
|---|---|---|---|---|---|---|---|---|
| XXh | 0 | 0 | True busyn<br>0: true busy<br>1: true ready | Slow erase detection Plane1<br>0: pass<br>1: fail | Slow erase detection Plane0<br>0: pass<br>1: fail | Erase verify Plane1<br>0: pass<br>1: fail | Erase verify Plane0<br>0: pass<br>1: fail | Erase verify chip<br>0: pass<br>1: fail |

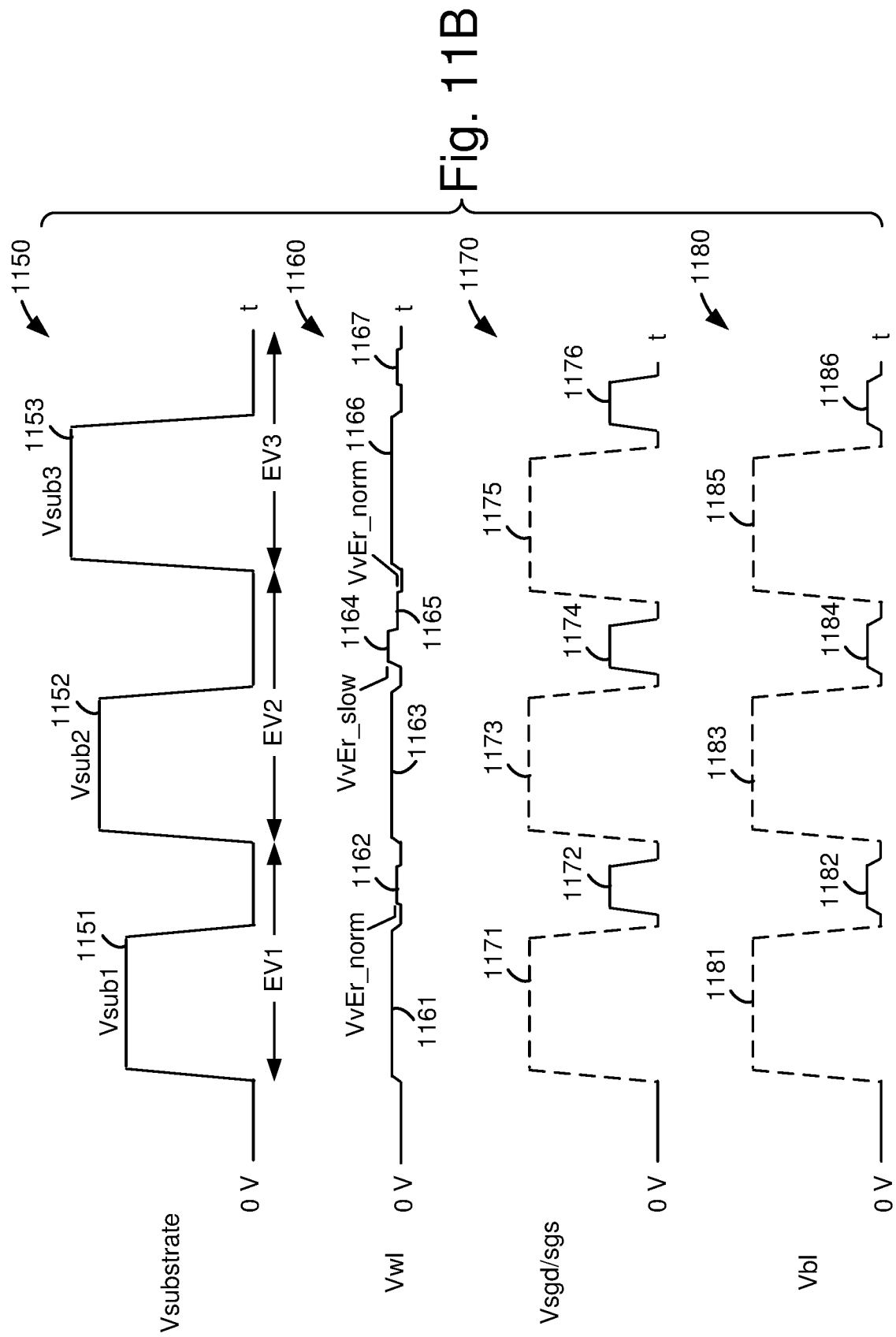

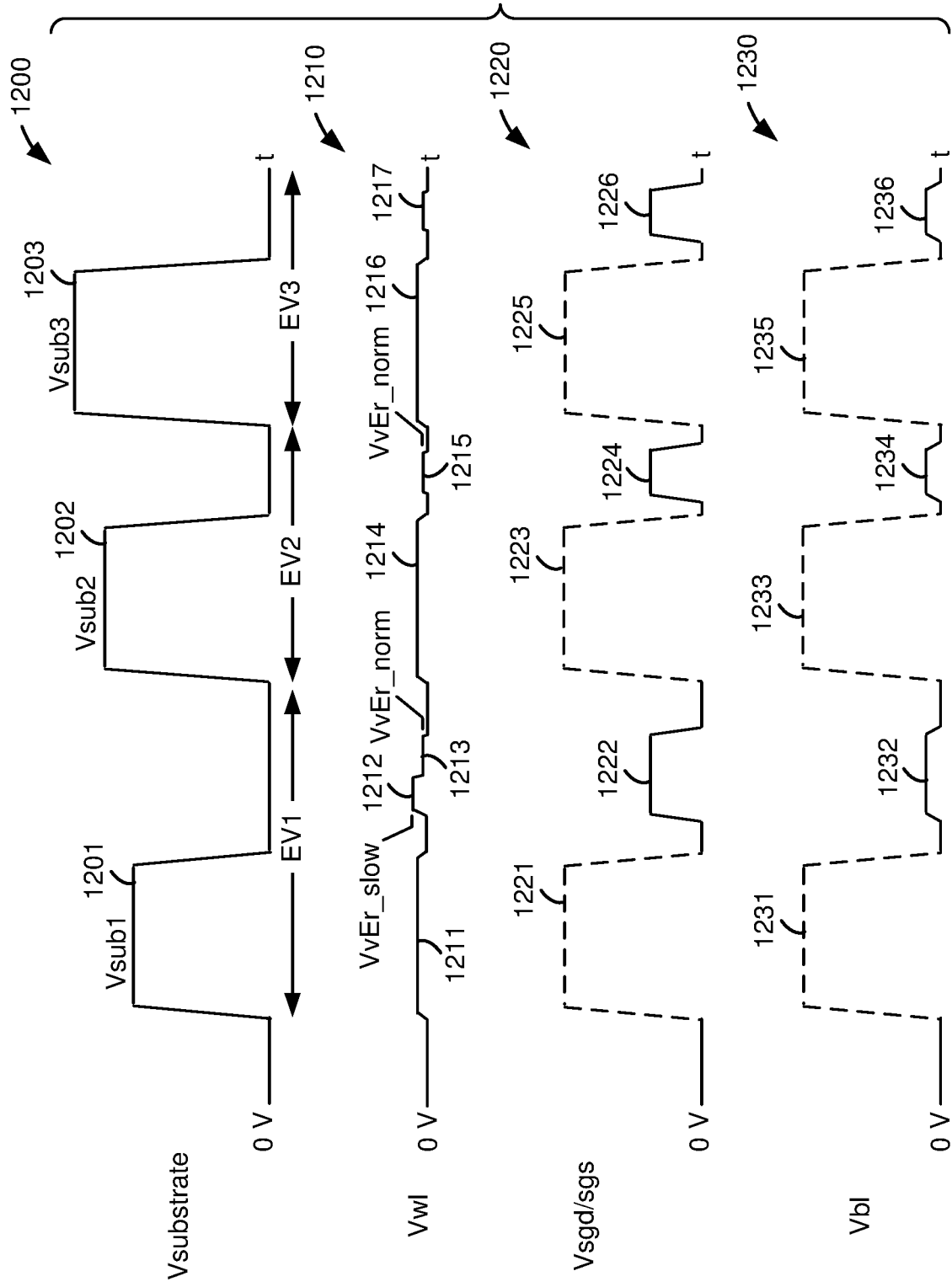

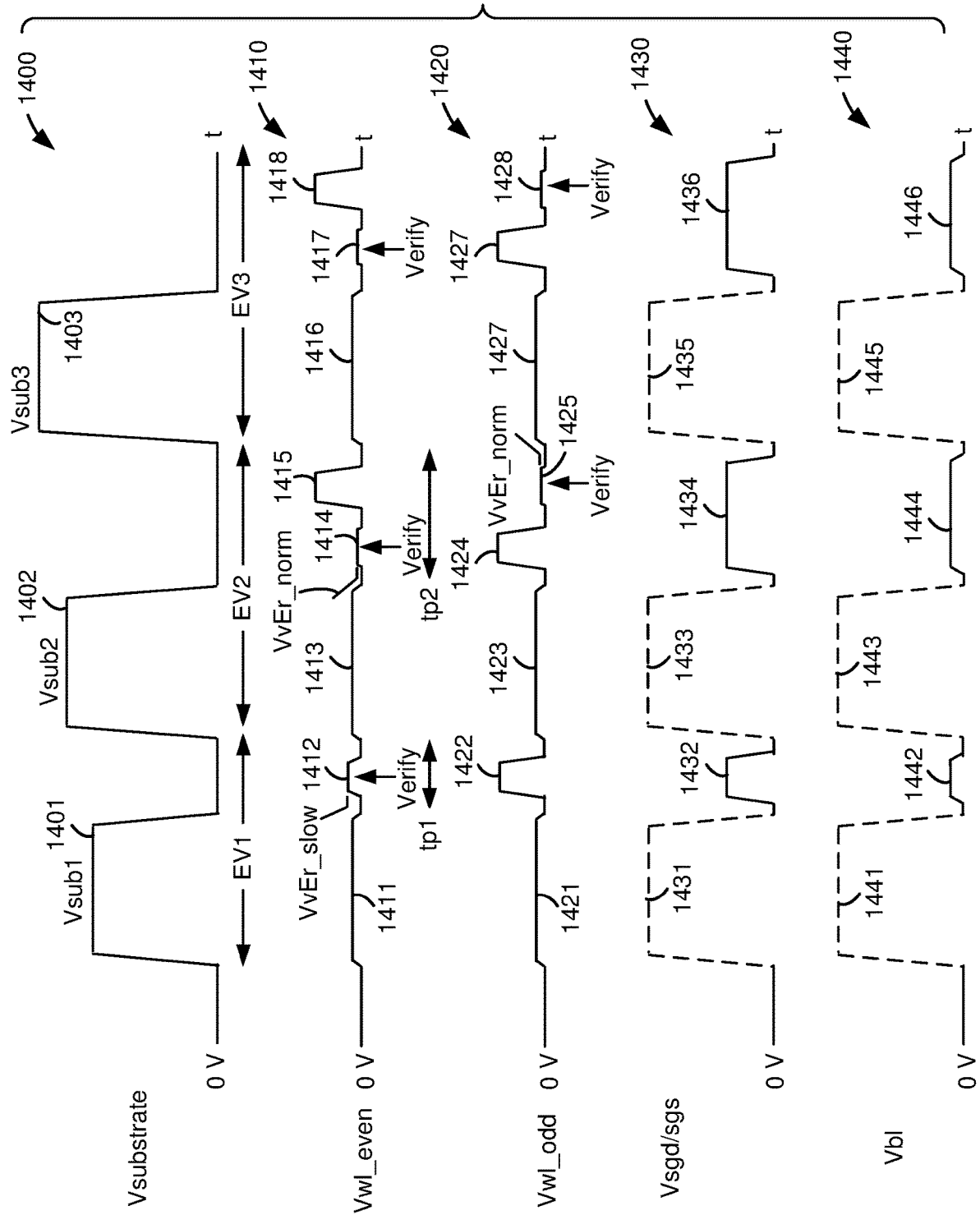

SMART ERASE VERIFY TEST TO DETECT SLOW-ERASING BLOCKS OF MEMORY CELLS

CLAIM OF PRIORITY

This application claims priority from Chinese Patent Application No. 202010228197.X, entitled, "SMART ERASE VERIFY TEST TO DETECT SLOW-ERASING BLOCKS OF MEMORY CELLS," filed Mar. 24, 2020, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 7A depicts an example view of NAND strings in the block B0-0 which is consistent with FIGS. 4 and 6.

FIG. 7B depicts an example top view of the block B0-0 of FIG. 7A, with respective NAND strings, bit lines and sense circuits.

FIG. 8A depicts threshold voltage (Vth) distributions for an eight-state memory device.

FIG. 8B depicts Vth distributions for the erased state, including a Vth distribution 810 for a slow-erasing block and a Vth distribution 811 for a normal block after an initial erase pulse is applied, and a Vth distribution 800 for the normal block after a final erase pulse is applied.

FIG. 8C depicts Vth distributions for the erased state for a slow-erasing block, after each of six erase-verify iterations, where the slow-erasing block is detected after a second erase pulse is applied.

FIG. 9C depicts a flowchart of an example erase operation consistent with FIG. 9A.

FIG. 10 depicts a table of commands consistent with FIG. 9B.

FIG. 11B depicts example voltage signals in an erase operation, consistent with FIGS. 8C, 9A and 9C-9E, where an all word line verify mode is used, a first verify test is performed in a second erase-verify iteration EV2, and a second verify test is performed in each of the erase-verify iterations EV1-EV3.

FIG. 12 depicts example voltage signals in an erase operation, consistent with FIGS. 9A and 9C-9E, where an all word line verify mode is used, first and second verify tests are performed in an initial erase-verify iteration EV1, and the second verify test is performed in the remaining erase-verify iterations EV2 and EV3.

FIG. 14 depicts example voltage signals in an erase operation, consistent with FIGS. 9A, 9C, 9F, 9G and 9H, where an alternate word line verify mode is used, a first verify test is performed for even-numbered word lines but not odd-numbered word lines in an initial erase-verify iteration EV1, and a second verify test is performed separately for even- and odd-numbered word lines in the remaining erase-verify iterations EV2 and EV3.

DETAILED DESCRIPTION

Figure 1:
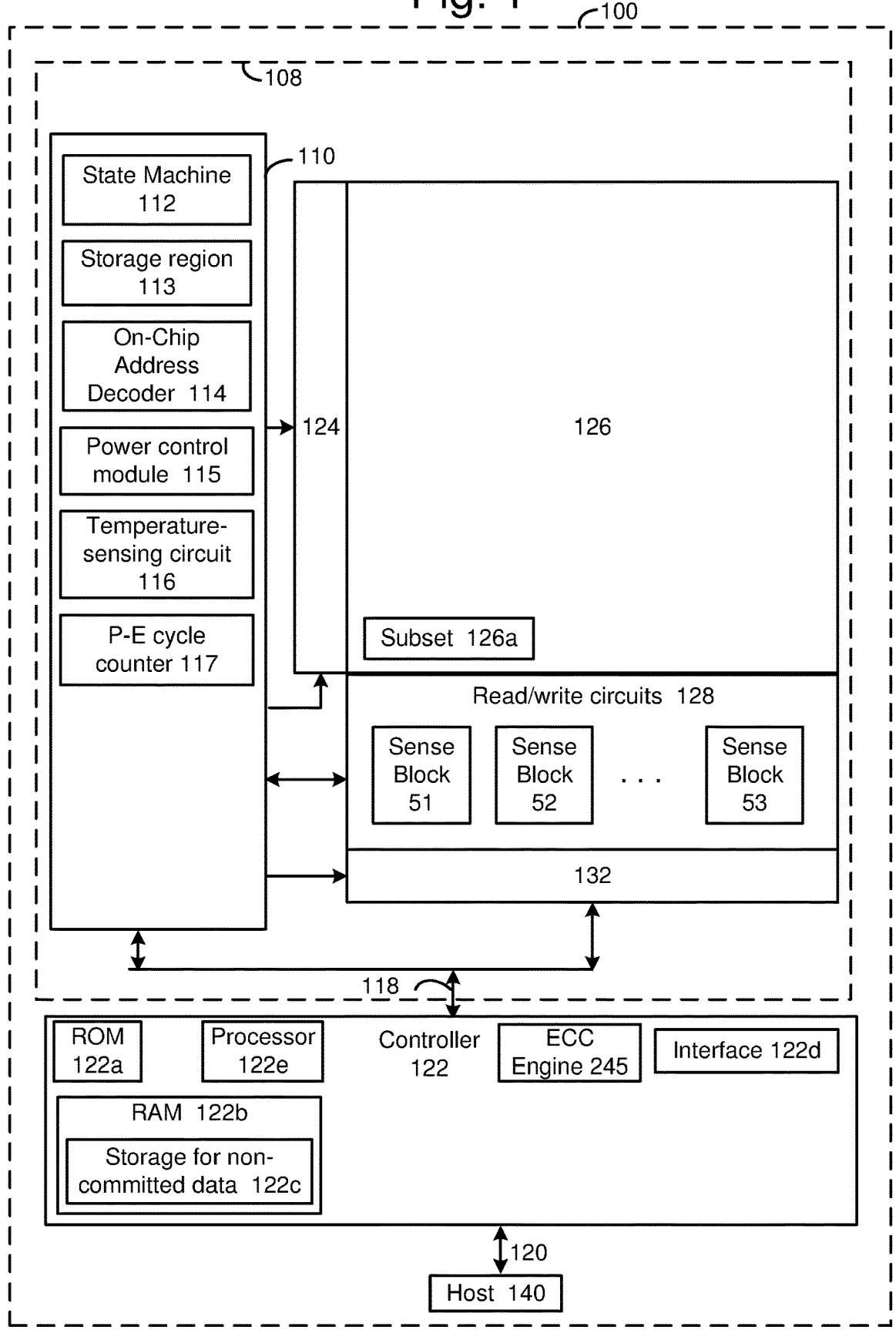
FIG. 1 is a block diagram of an example memory device.

Apparatuses and techniques are described for determining if a block of memory cells is slow-erasing during an erase operation for the block.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. For example, see FIG. 7A. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. For example, see the channel 660 and charge-trapping layer 664 in the NAND string 700n in FIG. 6. A source end 700s of the NAND string is connected to the substrate 611 and a drain end 700d of the NAND string is connected to a bit line, BL0. For example, see FIG. 6.

In a 2D memory structure, the memory cells may be arranged in horizontal NAND strings on a substrate.

An erase operation for memory cells in a block typically involves one or more erase-verify iterations, also referred to as erase loops, where each iteration involves channel boosting followed by a verify test, until the erase operation is completed. In each erase-verify iteration, the voltages of the channels are boosted while holding the voltages of the word lines at a low level, at or close to 0 V. The channels are boosted by applying one or more erase pulses to the block. See the voltage signal 1100 of FIG. 11A. In one approach, the erase pulse is applied to the substrate, causing holes to be injected into the channels via the source ends of the NAND strings. In another approach, the channels are boosted by generating holes at the source end and/or drain end of the NAND strings using gate-induced drain leakage (GIDL). This involves providing a strong back bias of the SGD and/or SGS transistors.

The boosting of the channels creates a large channel-to-gate voltage which drives holes into the charge trapping layers, lowering the threshold voltage (Vth) of the memory cells. A verify test, which is a sensing operation, can be performed after the application of the erase pulse to determine if the Vth of the memory cells has been lowered below a verify voltage. A verify test typically tests the erase level of a set of NAND strings by sensing a current in the set of NAND strings, as discussed, e.g., in connection with FIG. 7B. The erase operation is completed when the verify test is passed.

The erase operation is a fundamental function of a NAND memory device as it provides the memory cells at a known Vth level to prepare them for programming. Moreover, erase speed is an important performance metric for the memory device. In some cases, a block can be slow-erasing due to various factors such as an intrinsic poor erase efficiency, word line voltage floating, and leaky paths between word lines and the channel polysilicon. It is desirable to detect slow-erasing blocks as part of the silicon debugging progress, at the time of manufacture, as well as to enhance the quality of service of the final product in the customers' hands. In particular, some slow-erasing blocks can degrade over time, potentially resulting in uncorrectable read errors.

One approach to detecting slow-erasing blocks is to test the blocks to determine whether they can complete an erase operation within a maximum allowable number of erase-verify iterations. However, some slow-erasing blocks can complete an erase operation within an allowable number of erase-verify iterations before they later enter a failure mode in which the erase operation can no longer be successfully completed and/or uncorrectable read errors occur.

Another approach to detecting slow-erasing blocks is to measure the Vth of the memory cells after each of multiple erase pulses are applied to the block. An erase slope can then be determined as a performance metric. However, this cannot be done in situ, e.g., with the memory chip in place in the memory device, and is time consuming.

Techniques provided herein address the above and other issues. In one aspect, an erase operation is provided which provides in situ detection of slow-erasing blocks in a memory device. The erase operation can involve performing an additional verify test in a specified erase-verify iteration to check the position of the upper tail of the Vth distribution of the memory cells of a block. Generally, when N is the maximum allowable number of erase-verify iterations, the additional verify test can be in the first through N–$1^{st}$ erase-verify iteration. In one example depicted in FIG. 8B, the additional verify test is in the initial erase-verify iteration. In another example depicted in FIG. 8C, the additional verify test is in the second erase-verify iteration.

If the upper tail is too high, this indicates a slow-erasing block, even if the erase operation is subsequently successfully completed within an allowable number of erase-verify iterations. Moreover, commands can be provided which embed the additional verify test into a normal erase operation, e.g., an erase operation which does not check for a slow-erasing block.

In one approach, the specified erase-verify iteration also includes a normal verify test. The additional verify test (a first verify test) tests the Vth of the memory cells relative to a first verify voltage, while the normal verify test (a second verify test) tests the Vth of the memory cells relative to a second verify voltage which is lower than the first verify voltage. This approach accounts for the possibility that the erase operation is completed in the specified erase-verify iteration. The normal verify test, but not the additional verify test, is also used in one or more remaining erase-verify iterations of the erase operation to determine whether the erase operation has been successfully completed.

In another approach, the specified erase-verify iteration includes the verify test for a slow-erasing block but not the normal verify test. Instead, the normal verify test is only performed in the one or more remaining erase-verify iterations of the erase operation to determine whether the erase operation has been successfully completed. This approach assumes that the erase operation will not be completed in the specified erase-verify iteration, and can save time by omitting the normal verify test in the initial erase-verify iteration.

In some cases, the time penalty of the additional verify test can be reduced. For example, when the normal verify test involves an alternate word line verify mode, where normal verify test is performed separately for the even-numbered word lines and the odd-numbered word lines, the additional verify test can be performed for the even-numbered or odd-numbered word lines, but not both. See FIGS. 9G and 14.

Or, the additional verify test can be performed for the even-numbered word lines first, and if the verify test is passed, it can then be performed for the odd-numbered word lines. If the additional verify test is failed for the even-numbered word lines, a fail status can be returned and the additional verify test can be omitted for the odd-numbered word lines to save time. See FIGS. 9F and 14.

Alternatively, the additional verify test can be performed for the odd-numbered word lines first, and if the verify test is passed, it can then be performed on the even-numbered word lines. If the additional verify test is failed for the odd-numbered word lines, a fail status can be returned and the additional verify test can be omitted for the even-numbered word lines to save time.

These and other features are discussed further below.

FIG. 1 is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, and a program-erase (P-E) cycle counter 117. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device during the lifetime of the memory device, e.g., every minute. The P-E cycle counter 117 can track the number of P-E cycles for each block in the memory device. The number of P-E cycles can be used to adjust a verify voltage in a slow-erase verify test, as discussed in connection with FIG. 8B.

The circuits 116 and 117 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, P-E cycle counter 117, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate.

Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
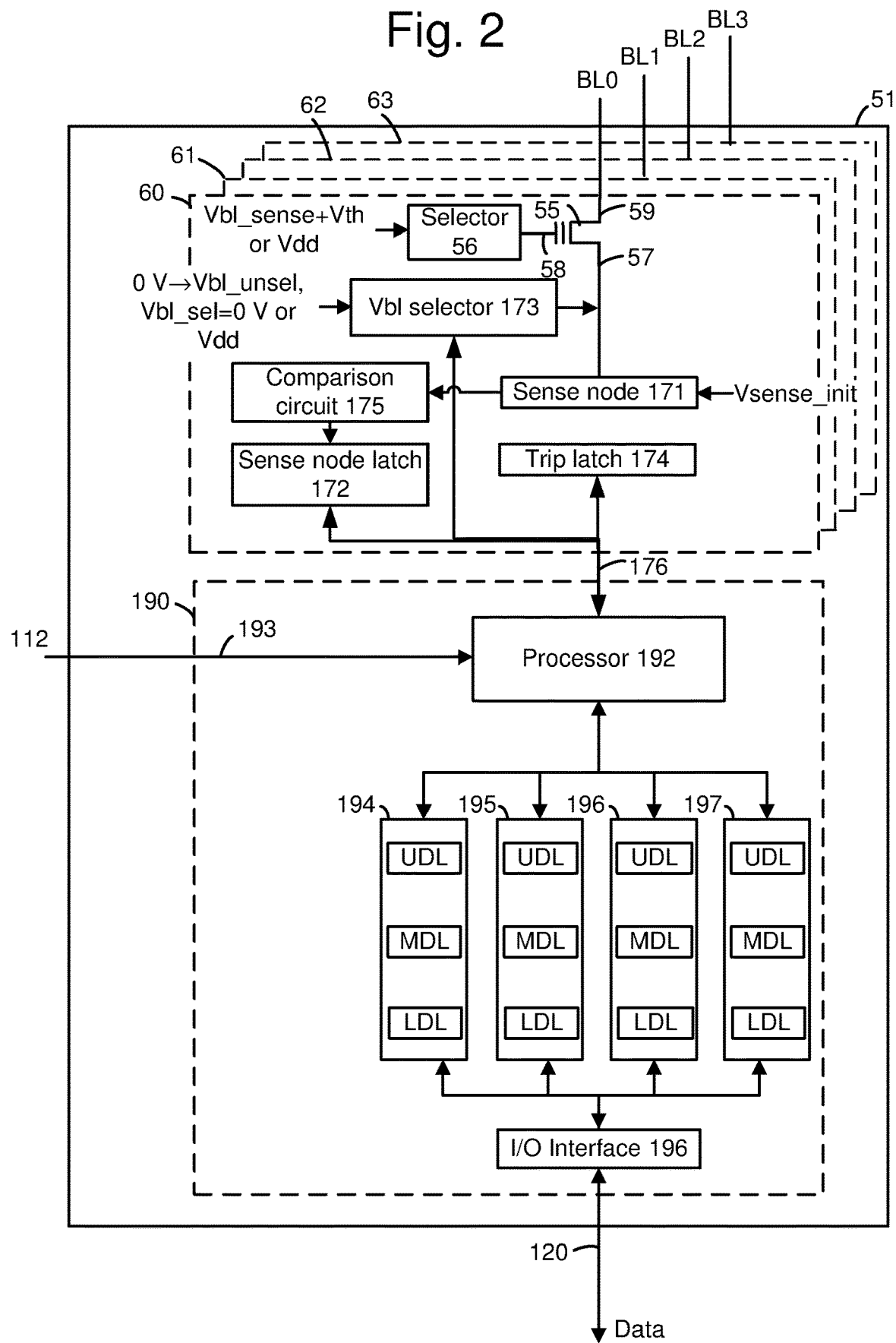
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a first verify test to determine whether a block is slow-erasing, and during a second verify test to determine whether an erase operation has been completed. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg–Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
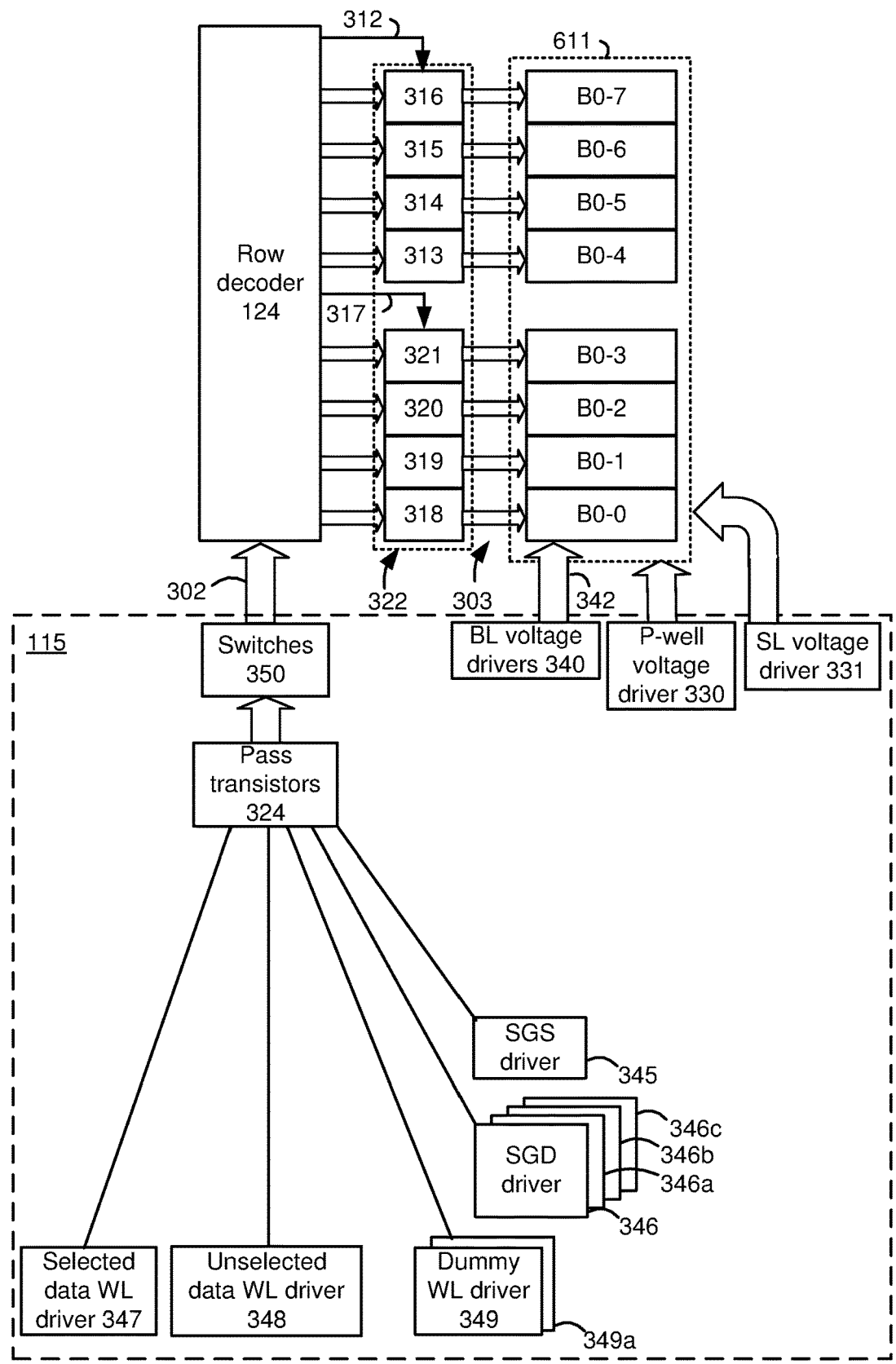
FIG. 3 depicts an example implementation of the power control circuit 115 of FIG. 1 for providing voltages to blocks of memory cells in a plane.

FIG. 3 depicts an example implementation of the power control circuit 115 of FIG. 1 for providing voltages to blocks of memory cells in a plane. The circuitry shown can be repeated for each plane of a die, in one approach. In this example, the memory structure 126 includes a set of four related blocks, B0-0 to B0-3, and another set of four related blocks, B0-4 to B0-7. See also FIG. 4. The blocks can be in one or more planes. The row decoder 124 of FIG. 1 provides voltages to word lines and select gate control lines of each block via pass transistors 322. In one approach, a separate row decoder is provided for each block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B0-4 to B0-7, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349a can be used to provide voltages on dummy word lines WLDD and WLDS, respectively, in FIG. 6.

The voltage drivers can also include separate SGD drivers for each sub-block. For example, SGD drivers 346, 346a, 346b and 346c can be provided for SB0, SB1, SB2 and SB3, respectively, such as in FIG. 7A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+ contact 612b in the p-well region 611b, e.g., via the conductive path 682. See FIG. 6. In one approach, the p-well region 611b is common to the blocks. Vp-well can be the same as Vsubstrate in FIG. 11A-14. A set of bit lines 342 is also shared by the blocks. The source line (SL) voltage driver 331 provides a voltage Vsl to the n+ contact 612c in the p-well region 611b, e.g., via the local interconnect 651.

Bit line voltage drivers 340 include voltage sources which provide voltages to the bit lines 342. The voltage for sensing in an erase verify test can be 0.5 V, for example.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
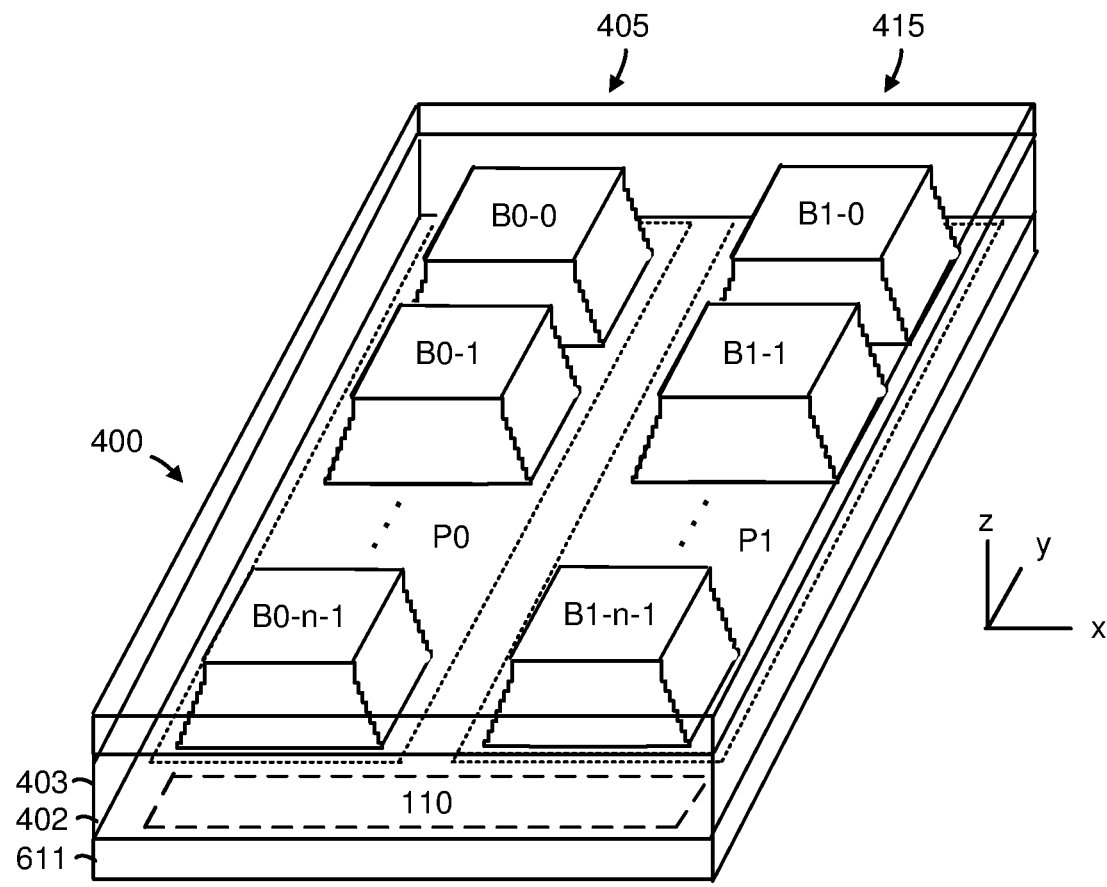
FIG. 4 is a perspective view of an example memory die 400 in which blocks are provided in respective planes P0 and P1, consistent with FIG. 1.

FIG. 4 is a perspective view of an example memory die 400 in which blocks are provided in respective planes P0 and P1, consistent with FIG. 1. The memory die includes a substrate 611, an intermediate region 402 in which blocks of memory cells are formed, and an upper region 403 in which one or more upper metal layers are patterned such as to form bit lines. Planes P0 and P1 represent respective isolation regions which are formed in the substrate 611. Further, a first block sequence 405 of a number n blocks, labeled B0-0 to B0-$n-1$, are formed in P0, and a second block sequence 415 of a number n blocks, labeled B1-0 to B1-$n-1$, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 611 can also carry circuitry under the blocks, and one or more lower metal layers which are patterned in conductive paths to carry signals of the circuitry. The commands in FIG. 10 provide a pass/fail status for erase operations in planes P0 and P1 as an example.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 5:
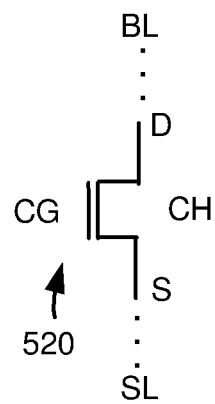
FIG. 5 depicts an example transistor 520 in the memory structure 126 of FIG. 1.

FIG. 5 depicts an example transistor 520 in the memory structure 126 of FIG. 1. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string.

Figure 6:
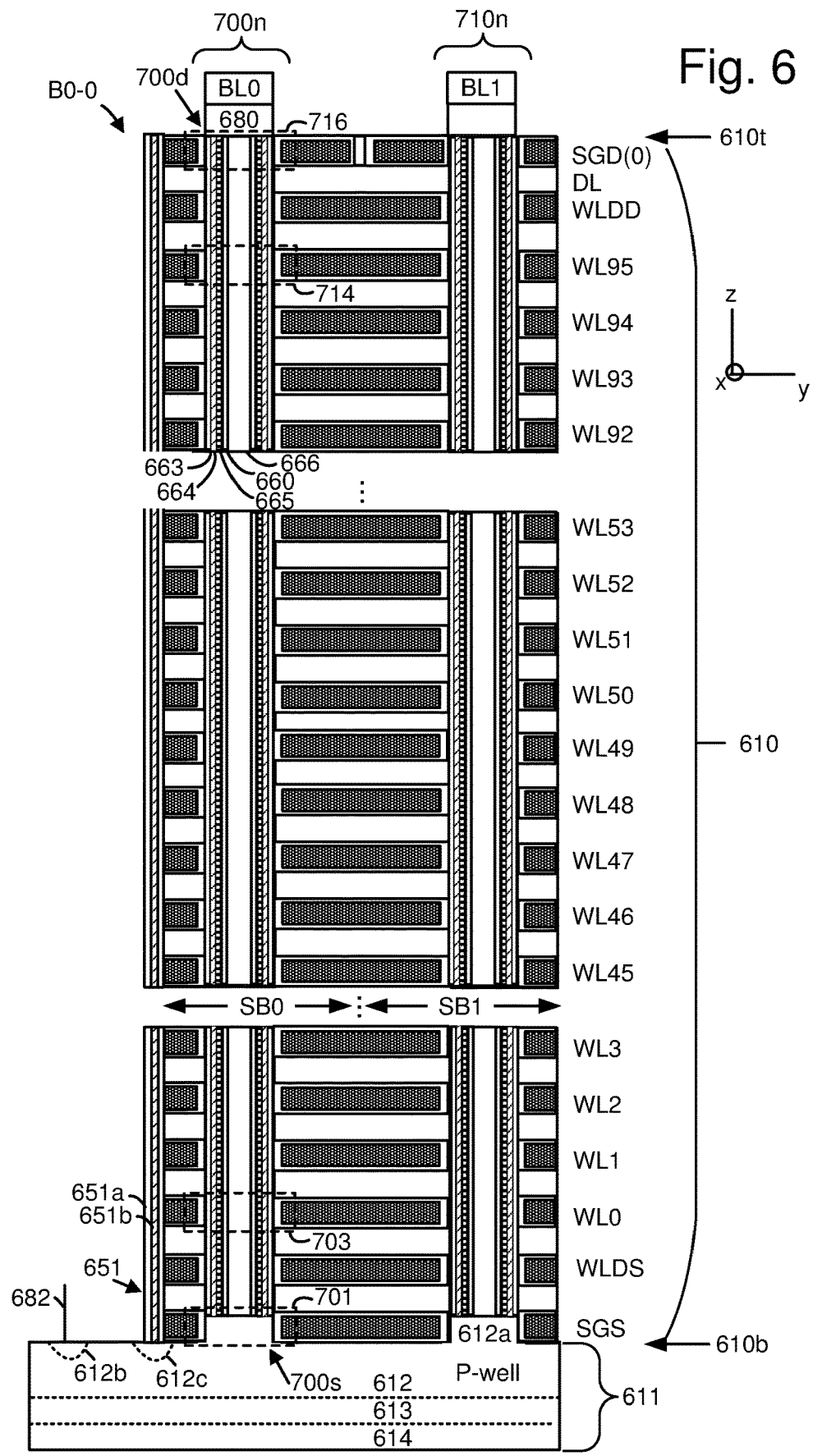
FIG. 6 depicts an example cross-sectional view of a portion of the block B0-0 of FIG. 4, including NAND strings 700n and 710n.

FIG. 6 depicts an example cross-sectional view of a portion of the block B0-0 of FIG. 4, including NAND strings 700n and 710n. In this example, the NAND strings 700n and 710n are in different sub-blocks SB0 and SB1, respectively. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611a (see also FIG. 3) connected to the source ends of the NAND strings. The p-well region may comprise epitaxial regions 612 which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

FIG. 7A depicts an example view of NAND strings in the block B0-0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

In a verify test in an erase operation, a verify voltage VvEr_slow or VvEr_norm is applied to the word lines. See FIG. 11A-14. At the same time, each sense circuit senses a current on a respective bit line based on a sum of the currents in the respective NAND strings connected to the bit line. For example, SC0 can sense a current on BL0 based on currents in the NAND strings 700n, 710n, 720n and 730n. In another possible approach, the sensing occurs one sub-block at a time for each bit line.

A number of sets of NAND strings can be counted which fail a verify test when a first verify voltage, VvEr_slow, is applied to the word lines. A set of NAND strings, or a corresponding portion of a block, fails a verify test when the sensed current in the NAND strings or corresponding portion of the block is less than a specified level. A failure indicates the Vth is higher than VvEr_slow for one or more memory cells in the set of NAND strings. In contrast, a set of NAND strings, or a corresponding portion of a block, passes a verify test when the sensed current in the set of NAND strings or corresponding portion of the block is greater than the specified level. A pass indicates the Vth is lower than VvEr_slow for all of the memory cells in the set of NAND strings. See also various examples of verify tests in FIG. 9D-9H.

FIG. 8A depicts threshold voltage (Vth) distributions for an eight-state memory device. Eight data states, or three bits per cell, are depicted as an example. The techniques herein can apply to other modes include one or more bits per cell. In FIG. 8A-8C, the vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 800 is obtained, representing the erased state. The erase operation is completed when the Vth of all, or nearly all, of the memory cells is below a verify level of VvEr_norm.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 801-807, respectively. These memory cells are subject to verify tests using verify voltages of VvA-VvG. The programming of the higher state memory cells can disturb the erased state memory cells, resulting in the widened and upshifted Vth distribution 800a.

FIG. 8B depicts Vth distributions for the erased state, including a Vth distribution 810 for a slow-erasing block and a Vth distribution 811 for a normal block after an initial erase pulse is applied, and a Vth distribution 800 for the normal block after a final erase pulse is applied. A slow-erasing block can be detected by evaluating an upper tail of the Vth distribution of the memory cells of the block after an initial erase pulse has been applied to the block. The evaluation involves a verify test in the initial erase-verify iteration.

More generally, a slow-erasing block can be detected by evaluating an upper tail of the Vth distribution of the memory cells of the block after an erase pulse in a specified erase-verify iteration of an erase operation, where the specified erase-verify iteration can be the initial erase-verify iteration or other subsequent erase-verify iteration of the erase operation.

The Vth distribution of the memory cells can be evaluated relative to a first verify voltage, VvEr_slow, by sensing a current in the NAND strings when VvEr_slow is applied to the word lines. In this example, a sensing operation for a slow-erasing block would indicate that a portion of the NAND strings and memory cells have not been erased to a Vth below VvEr_slow. These NAND strings and memory cells are represented by the region 810a of the Vth distribution 810. See also the example voltage signals in FIG. 11A.

In contrast, a sensing operation relative to VvEr_slow for a block with a normal erase speed would indicate that all, or nearly all, of the NAND strings and memory cells have been erased to a Vth below VvEr_slow. Sensing operations can also be performed relative to VvEr_norm, a second verify voltage, depicted in FIG. 8A. VvEr_norm is the normal erase verify voltage which is used to determine whether the erase operation is completed. This sensing operation would reveal that, for a slow-erasing block, a large portion of the NAND strings and memory cells have a Vth above VvEr_norm. For a block with a normal erase speed, the sensing operation would reveal that all, or nearly all, of the NAND strings and memory cells have been erased to a Vth below VvEr_norm.

The control circuit can count a number of sets of NAND strings which fail a verify test. Using a verify voltage which is higher than the normal verify voltage to detect slow-erasing blocks results in a lower count and therefore a simpler design. For example, the count of sets of NAND strings which fail the verify test relative to VvEr_slow can be limited to, e.g., 1-5% of the sets of NAND strings. Once the count exceeds 1-5%, the block is considered to be slow-erasing and there is no need to count additional sets of NAND strings. In contrast, using the normal verify voltage to detect slow-erasing blocks would require the ability to count to a higher number and therefore result in a more complex design. For example, it might be necessary to count to, e.g., 10-20% or more of the sets of NAND strings. This can be visualized by considering the portion of the Vth distribution 810 which exceeds VvEr_norm.

The Vth distribution 800 represents the normal-erasing (e.g., not slow-erasing) block after the erase operation is completed, when one or more remaining erase-verify iterations are performed after the initial erase-verify iteration.

VvEr_slow can be adjusted based on various factors. For example, VvEr_slow can be increased as the number of P-E cycles increases. A block can be harder to erase, requiring more erase loops, when the number of P-E cycles increases. Accordingly, if a block with high P-E cycles is tested using VvEr_slow, a larger than desired number of blocks may be classified as slow-erasing. Increasing VvEr_slow as P-E cycles increase helps ensure that only the truly slow-erasing blocks are classified as slow erasing. This applies when the slow-erasing block is detected over the lifetime of the memory device while it is in the end user's hands.

FIG. 8C depicts Vth distributions for the erased state for a slow-erasing block, after each of six erase-verify iterations, where the slow-erasing block is detected after a second erase pulse is applied. The Vth distributions 820-825 represent the slow-erasing block after the first through sixth erase pulses are applied to the block. The block passes the verify test relative to VvEr_norm after the sixth erase pulse. In comparison, a block with a normal erase speed might pass the verify test relative to VvEr_norm after fewer erase pulses, e.g., one to five erase pulses. In this example, the test for a slow-erasing block occurs after the second erase pulse rather than after the initial erase pulse, as in FIG. 8B. The Vth distribution of the memory cells is evaluated relative to a first verify voltage, VvEr_slow, by sensing a current in the NAND strings when VvEr_slow is applied to the word lines. A sensing operation for a slow-erasing block indicate that a portion of the NAND strings and memory cells have not been erased to a Vth below VvEr_slow. These NAND strings and memory cells are represented by the region 821a of the Vth distribution 820. VvEr_slow is lower in FIG. 8C than in FIG. 8B in these examples.

See also the example voltage signals in FIG. 11B.

Generally, as mentioned, the test for a slow-erasing block can occur after a specified erase pulse, whether it is the initial erase pulse or a subsequent erase pulse such as the second or third erase pulse.

Figure 9A:
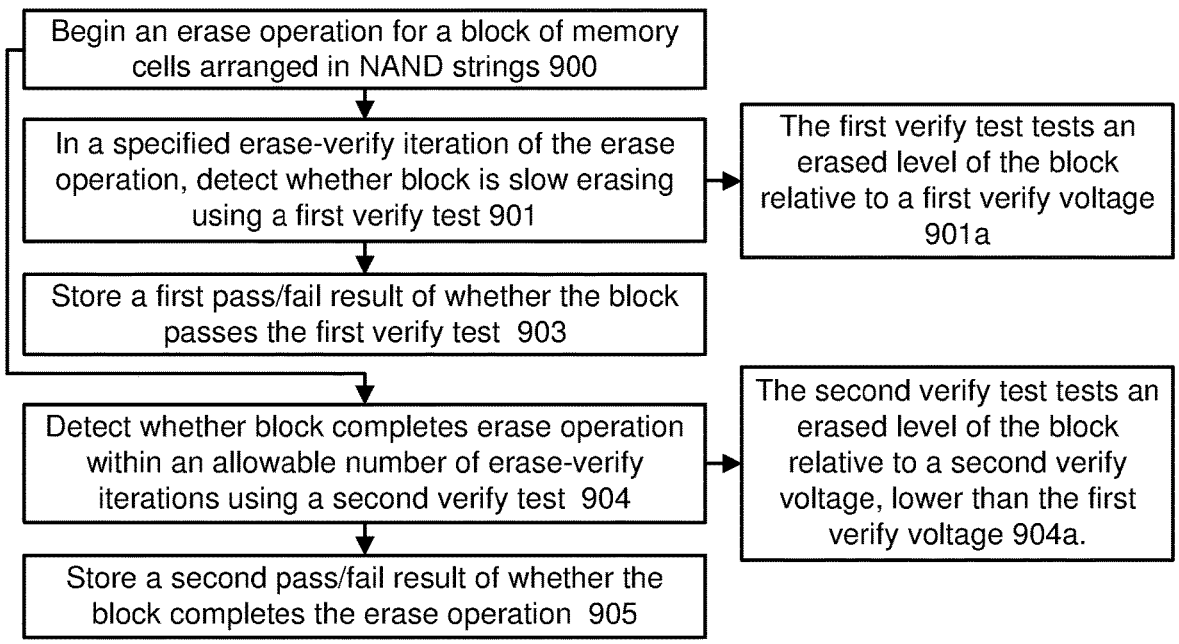
FIG. 9A depicts a flowchart of an example erase operation in which a slow-erasing block is detected.

FIG. 9A depicts a flowchart of an example erase operation in which a slow-erasing block is detected. Step 900 begins an erase operation for a block of memory cells arranged in NAND strings. Step 901 includes, in a specified erase-verify iteration of the erase operation, detecting whether the block is slow-erasing using a first verify test. The specified erase-verify iteration can be an initial erase-verify iteration or other erase-verify iteration of an erase operation. For example, as mentioned, when N is the maximum allowable number of erase-verify iterations, the additional verify test can be in the first through N–1$^{st}$ erase-verify iteration. In other words, the detecting of the slow-erasing block can be done after the nth erase pulse, where 1<=n<N, and N is the maximum erase loop count. Detecting the upper tail of the Vth distribution after the 1st or 2nd erase pulse, as in FIGS. 8B and 8C, respectively, are two examples, when n=1 and n=2, respectively. Generally, n can equal to 1,2,3, . . . , N–1

The specified erase-verify iteration can be predetermined before the erase operation begins. Step 901a notes that the first verify test tests an erase level of the block relative to a first verify voltage, VvEr_slow. The erased level of the block is based on the threshold voltages of its memory cells. Step 903 stores a first pass/fail result of whether the block passes the first verify test. See FIG. 10 for an example format in which pass/fail results of erase operations can be stored and reported.

Step 904 detects whether the block completes the erase operation within an allowable number of erase-verify iterations using a second verify test. Step 904a notes that the second verify test tests an erase level of the block relative to a second verify voltage, VvEr_norm, which is lower than the first verify voltage. Step 905 stores a second pass/fail result of whether the block passes the second verify test.

The detection of the erase completion can be done in erase-verify iterations which include the specified erase-verify iteration. Or, the detection of the erase completion can be done in erase-verify iterations which do not include the specified erase-verify iteration. This can involve, e.g., performing the specified erase-verify iteration as an initial erase-verify iteration of an erase operation, and detecting the erase completion in one or more remaining erase-verify iterations of the erase operation.

Figure 9B:
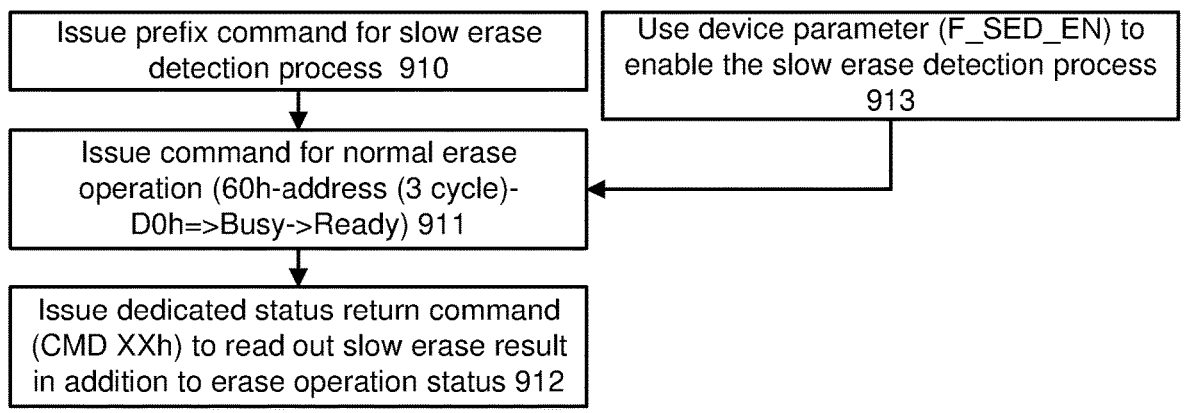
FIG. 9B depicts a flowchart of an example sequence of commands to perform the process of FIG. 9A.

FIG. 9B depicts a flowchart of an example sequence of commands to perform the process of FIG. 9A. In one possible approach, the detection of a slow-erasing block using the first verify test is initiated using a prefix command which is transmitted with an erase command to the memory chip. A control circuit can be configured to perform the first verify test in response to receipt of a prefix command which precedes a command to perform the second verify test. In another possible approach, the detection is initiated by a device parameter on the memory chip.

Generally, commands can be issued by the off-chip controller 122 to the on-chip control circuitry 110 including the state machine 112 in connection with an erase operation. The on-chip control circuitry 110 including the state machine 112 can report back to the controller 122 with a status of the erase operation and the slow block detection. In this case, step 910 includes issuing a prefix command for a slow erase detection process. A prefix command is a command which precedes another related command. The prefix command can have a desired format and comprise one or more bytes, for instance. Step 911 includes issuing a command for a normal erase operation. An example of such a command is in the format: 60h-address (3 cycle)-D0h=>Busy→Ready. "60h" denotes an erase block command in a first command cycle. "address (3 cycle)" denotes a 3 cycle or byte address of a block to be erased. The address can include information such as to identify a plane and a block, for example. "D0h" denotes a second command cycle. "Busy" indicates that a ready/busy pin of the chip has a busy status and "Ready" indicates that the ready/busy pin of the chip has a ready status.

Step 912 includes issuing a dedicated status return command (CMD XXh, See FIG. 10) to read out the slow erase result in addition to the erase operation status. For example, the slow erase result can include a pass/fail status (where a pass indicates the block is not slow-erasing and a fail indicates the block is slow-erasing), and the erase operation status can include a pass/fail status of the erase operation (where a pass indicates the erase operation has completed within an allowable number of erase-verify iterations and a fail indicates the erase operation has not completed within the allowable number of erase-verify iterations).

Alternatively, step 913 involves using a device parameter, referred to as F_SED_EN, to enable the slow erase detection process. The device parameter can be defined in a list of commands which are used by the chip. Steps 911 and 912 are then followed.

FIG. 9C depicts a flowchart of an example erase operation consistent with FIG. 9A. In this example, the slow erase detection is performed in the initial erase-verify iteration. Step 920 begins an erase operation for a block of memory cells arranged in NAND strings. Step 921 begins an initial erase-verify iteration of the erase operation. Step 922 includes initializing an erase loop count (ELC)=1 to denote the first program-verify iteration. Step 923 includes charging up the channels of the NAND strings. As mentioned, in one approach, an erase pulse is applied to the substrate, causing holes to be injected into the source ends of the NAND strings and thereby increase the channel voltage. See the erase pulses 1101-1103 in the example voltage signal 1100 of FIG. 11A. In another approach, the channels are boosted by generating holes at the source end and/or drain end of the NAND strings using GIDL. Step 924 includes performing a first verify test which tests an erased level of the block relative to a first verify voltage (VvEr_slow).

A decision step 925 determines whether the block passes the first verify test. The block may pass a verify test when all, or nearly all, of the sets of NAND strings of the block, pass the verify test. In other words, none, or no more than a specified portion of the sets of NAND strings of the block, fail the verify test.

As mentioned in connection with FIG. 7B, the verify test can involve sensing a current in a set of NAND strings connected to each bit line. A set of NAND strings passes the verify test if the current is above a specified level, e.g., the threshold voltages of the memory cells in the set of NAND strings are below the verify voltage. A block passes the verify test if all, or nearly all, of the set of NAND strings pass the verify test. In other words, a block passes the verify test if none, or no more than a specified portion of the sets of NAND strings of the block, fail the verify test. If the decision step 925 is true, step 925a stores a pass result for the first verify test. This means the block is not slow-erasing. If step 925 is false, step 925b stores a fail result for the first verify test. This means the block is slow-erasing.

After step 925, one of two paths can be followed. In a first path "A," step 928 performs a second verify test which tests an erased level of the block relative to a second verify voltage (VvEr_norm). A decision step 929 determines whether the block passes the second verify test. If the decision step 929 is true, step 929a stores a pass result for the second verify test and the erase operation ends. The pass result means the erase operation is completed within an allowable number of erase-verify iterations. If the decision step 929 is false, a decision step 930 determines whether ELC is less than a maximum allowable ELC. If the decision step 930 is false, step 930a stores a fail result for the second verify test (and the erase operation) and ends the erase operation. This means the block has failed to complete the erase operation. If the decision step 930 is true, ELC is incremented at step 931 and a next erase-verify iteration begins at step 926.

In a second path "B" after step 925, step 926 begins a next erase-verify iteration. In this case, the second verify test is not performed in the initial erase-verify iteration. Step 927 includes charging up the channels of the NAND strings. Step 928 is then reached, as discussed.

Figure 9D:
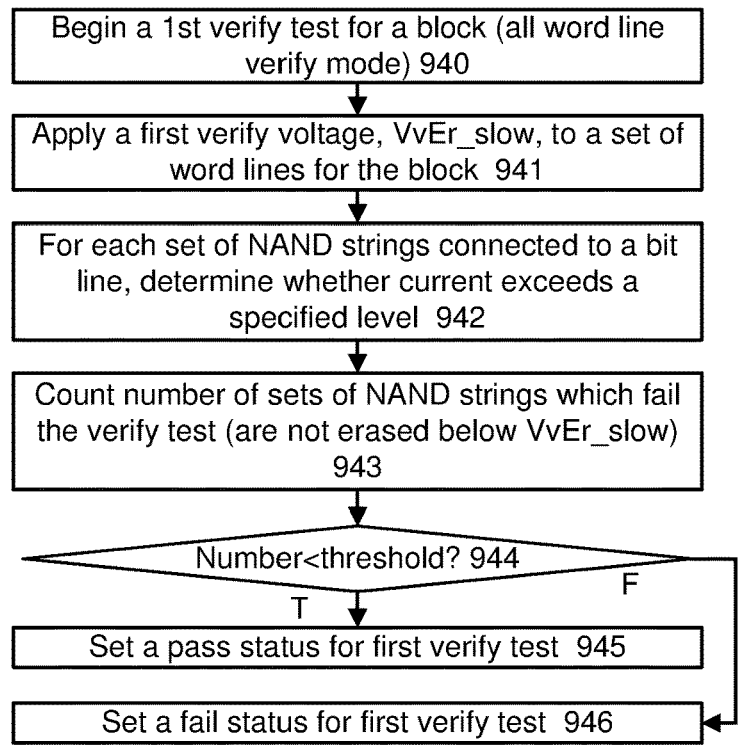
FIG. 9D depicts a flowchart of a first verify test for a block in an all word line verify mode, consistent with FIGS. 9A and 9C.

FIG. 9D depicts a flowchart of a first verify test for a block in an all word line verify mode, consistent with FIGS. 9A and 9C. Step 940 begins a first verify test for a block in an all word line verify mode. This is a mode in which a verify voltage is applied to all of the data word lines in a block while sensing currents in the NAND strings. See FIG. 11A-12. Step 941 applies a first verify voltage, VvEr_slow, to a set of word lines for the block. For example, in FIG. 7A, the set of word lines is WL0-WL95. Step 942 includes, for each set of NAND strings connected to a bit line, determining whether the current exceeds a specified level. This involves, e.g., determining whether a current on a bit line connected to the set of NAND strings is above or below a specified level. If the current is above the specified level, the set of NAND strings passes the verify test. If the current is below the specified level, the set of NAND strings fails the verify test.

Step 943 includes counting the number of sets of NAND strings which fail the verify test and are therefore not erased below VvEr_slow. A decision step 944 determines whether the number counted in step 943 is below a threshold. If the decision step is true, step 945 sets a pass status for the first verify test. This means the block is not slow-erasing. If the decision step is false, step 946 sets a fail status for the first verify test. This means the block is slow-erasing.

Figure 9E:
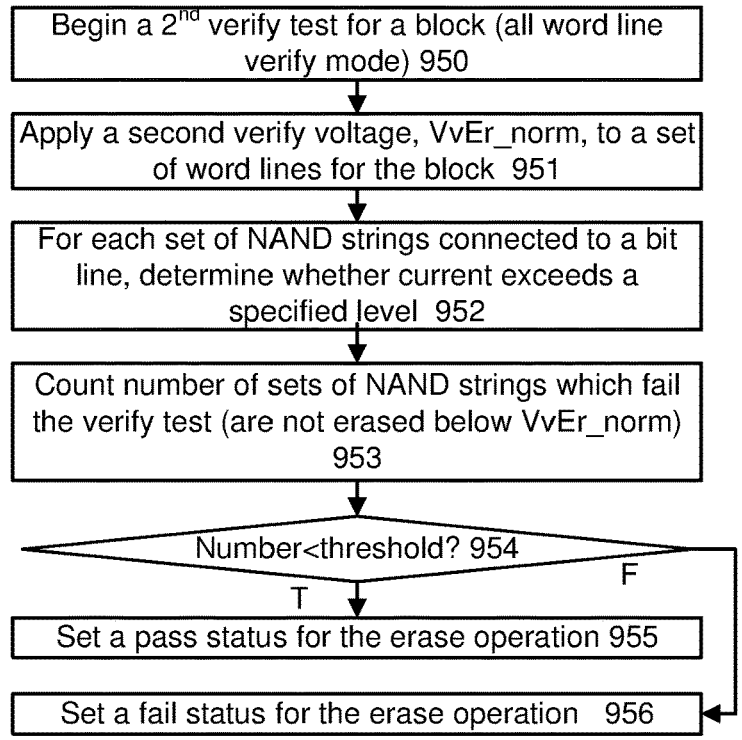
FIG. 9E depicts a flowchart of a second verify test for a block in an all word line verify mode, consistent with FIGS. 9A and 9C.

FIG. 9E depicts a flowchart of a second verify test for a block in an all word line verify mode, consistent with FIGS. 9A and 9C. Step 950 begins a second verify test for a block in an all word line verify mode. Step 951 applies a second verify voltage, VvEr_norm, to a set of word lines for the block. Step 952 includes, for each set of NAND strings connected to a bit line, determining whether the current exceeds a specified level.

Step 953 includes counting the number of sets of NAND strings which fail the verify test and are therefore not erased below VvEr_norm. A decision step 954 determines whether the number counted in step 953 is below a threshold. This threshold can be the same as, or different than, the threshold of step 944. If the decision step is true, step 955 sets a pass status for the second verify test. This means the erase operation is completed. If the decision step is false, step 956 sets a fail status for the first verify test. This means the erase operation is not yet completed.

Figure 9F:
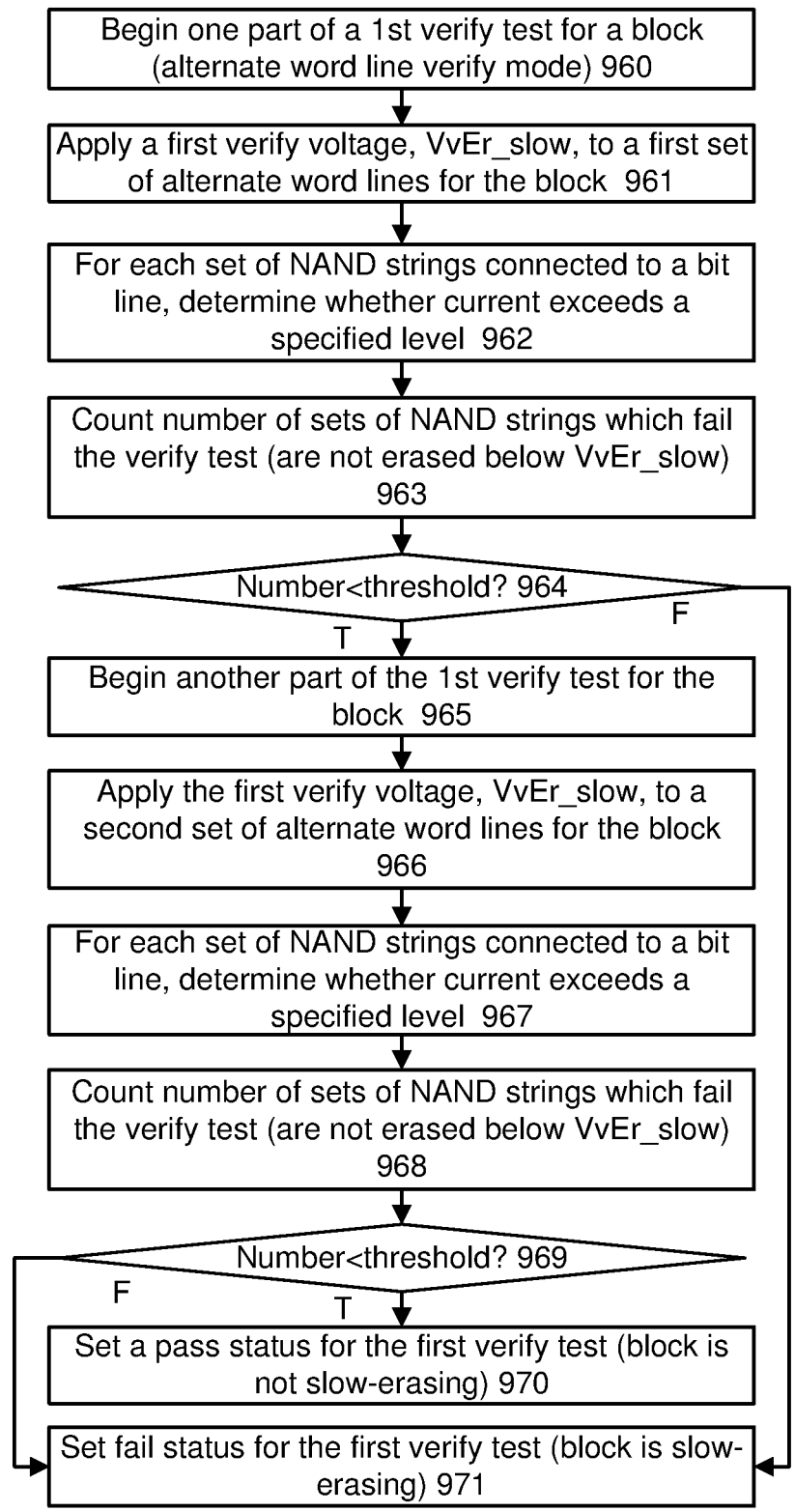
FIG. 9F depicts a flowchart of a first verify test for a block in an alternate word line verify mode, consistent with FIGS. 9A and 9C, where the first verify test is omitted for the second set of alternate word lines if the first verify test of the first set of alternate word lines is failed.

FIG. 9F depicts a flowchart of a first verify test for a block in an alternate word line verify mode, consistent with FIGS. 9A and 9C, where the first verify test is omitted for the second set of alternate word lines if the first verify test of the first set of alternate word lines is failed. As mentioned, in an alternate word line verify mode, a verify test is performed separately for the even-numbered word lines (e.g., WL0, WL2, WL4 . . . in FIG. 7A) and the odd-numbered word lines (e.g., WL1, WL3, WL5 . . . in FIG. 7A). This approach can provide a more accurate result of whether a block is uniformly erased. Step 960 begins one (a first) part of a first verify test for a block using the alternate word line verify mode. Step 961 includes applying a first verify voltage, VvEr_slow, to a first set of alternate word lines for the block. For example, the first set of alternate word lines can be the even-numbered word lines and the second set of alternate word lines can be the odd-numbered word lines. Or, the first set of alternate word lines can be the odd-numbered word lines and the second set of alternate word lines can be the even-numbered word lines. Step 962 includes, for each set of NAND strings connected to a bit line, determining whether the current exceeds a specified level. Step 963 includes counting a number of sets of NAND strings which fail the verify test, e.g., are not erased below VvEr_slow. A decision step 964 determines whether the number from step 963 is below a threshold.

If the decision step 964 is false, this means a significant number of sets of NAND strings failed the first verify test, in response to which step 971 sets a fail status for the first verify test. This approach saves time by setting the fail status immediately and omitting the first verify test for the second set of alternate word lines when the sensing of the first set of alternate word lines indicates that the block is slow-erasing. In another approach, the first verify test is performed for the second set of alternate word lines even when the first set of alternate word lines fail the first verify test. A fail status can be set if both the first set of alternate word lines and the second set of alternate word lines fail the first verify test. In this case, the block is uniformly slow-erasing. Or, a pass status can be set if the first or second set of alternate word lines, but not both sets, pass the first verify test. In this case, the block is not uniformly slow-erasing. In another option, a fail status can be set if the first or second set of alternate word lines, but not both sets, pass the first verify test.

If the decision step 964 is true, this means no more than an insignificant number of sets of NAND strings failed the first verify test, and steps 965 begins another (second) part of the first verify test for the block. Step 966 includes applying the first verify voltage, VvEr_slow, to a second set of alternate word lines for the block. Step 967 includes, for each set of NAND strings connected to a bit line, determining whether the current exceeds a specified level. Step 968 includes counting a number of sets of NAND strings which fail the verify test, e.g., are not erased below VvEr_slow. A decision step 969 determines whether the number from step 968 is below a threshold. If the decision step 969 is false, step 971 sets a fail status for the first verify test. In this case, the block is uniformly slow-erasing. If the decision step 969 is true, step 970 sets a pass status for the first verify test. In this case, the block is uniformly not slow-erasing.

In an example implementation, the first verify test comprises one part (steps 960-964) in which the control circuit is configured to sense currents in the NAND strings while applying a first verify voltage to a first set of alternate word lines of the set of word lines, and a control circuit is configured to report that the block is a slow-erasing block (step 971) if the block fails the one part of the first verify test.

Additionally, if the block passes the one part of the first verify test (step 964), the first verify test comprises another part (steps 965-969) in which the control circuit is configured to sense currents in the NAND strings while applying the first verify voltage to a second set of alternate word lines of the set of word lines. The control circuit is configured to report (step 971) that the block is a slow-erasing block if the block passes the one part of the first verify test and fails the another part of the first verify test, and the control circuit is configured to report that the block is not a slow-erasing block (step 970) if the block passes the one part of the first verify test and the another part of the first verify test.

Figure 9G:
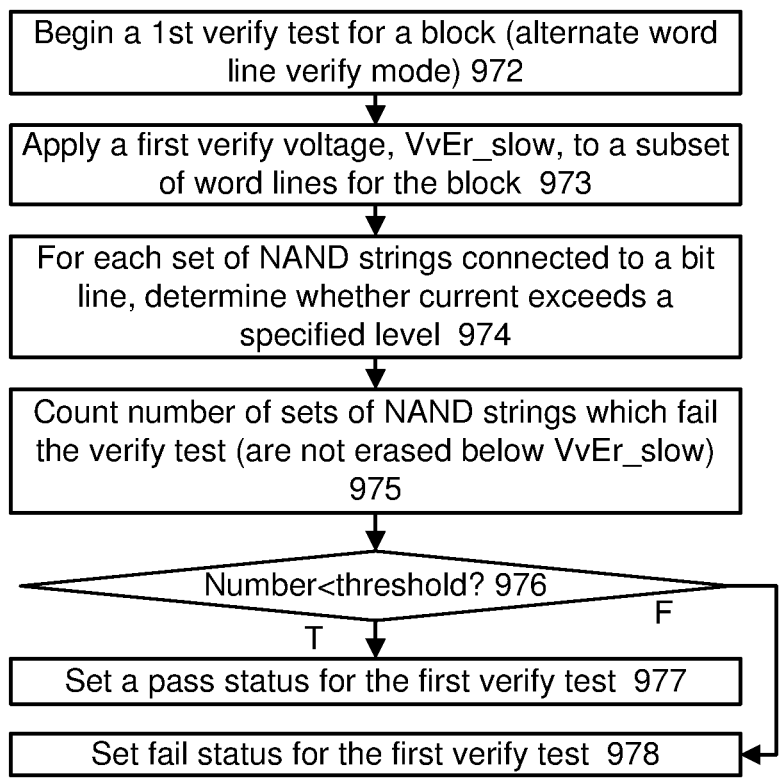
FIG. 9G depicts a flowchart of a first verify test for a block in an alternate word line verify mode, consistent with FIGS. 9A and 9C, where the first verify test is performed only for a subset of the set of word lines of a block.

FIG. 9G depicts a flowchart of a first verify test for a block in an alternate word line verify mode, consistent with FIGS. 9A and 9C, where the first verify test is performed only for a subset of the set of word lines of a block. In this example, the first verify test is performed on memory cells connected to a strict subset of the data word lines, e.g., fewer than all data word line of the block. For example, the subset can comprise even-numbered word lines or odd-numbered word lines, although other approaches are possible. This approach can save time in performing the first verify test, particularly when the alternate word line verify mode is used for the second verify test. This approach provides a rough but adequate indication of whether the block is slow-erasing.

Step 972 begins a first verify test for a block using a subset word line verify mode. Step 973 includes applying a first verify voltage, VvEr_slow, to a subset of word lines for the block. Step 974 includes, for each set of NAND strings connected to a bit line, determining whether the current exceeds a specified level. Step 975 includes counting a number of sets of NAND strings which fail the verify test, e.g., are not erased below VvEr_slow. A decision step 976 determines whether the number from step 975 is below a threshold. If the decision step 976 is false, step 978 sets a fail status for the first verify test. In this case, the block is considered to be slow-erasing. If the decision step 976 is true, step 977 sets a pass status for the first verify test. In this case, the block is not slow-erasing.

Figure 9H:
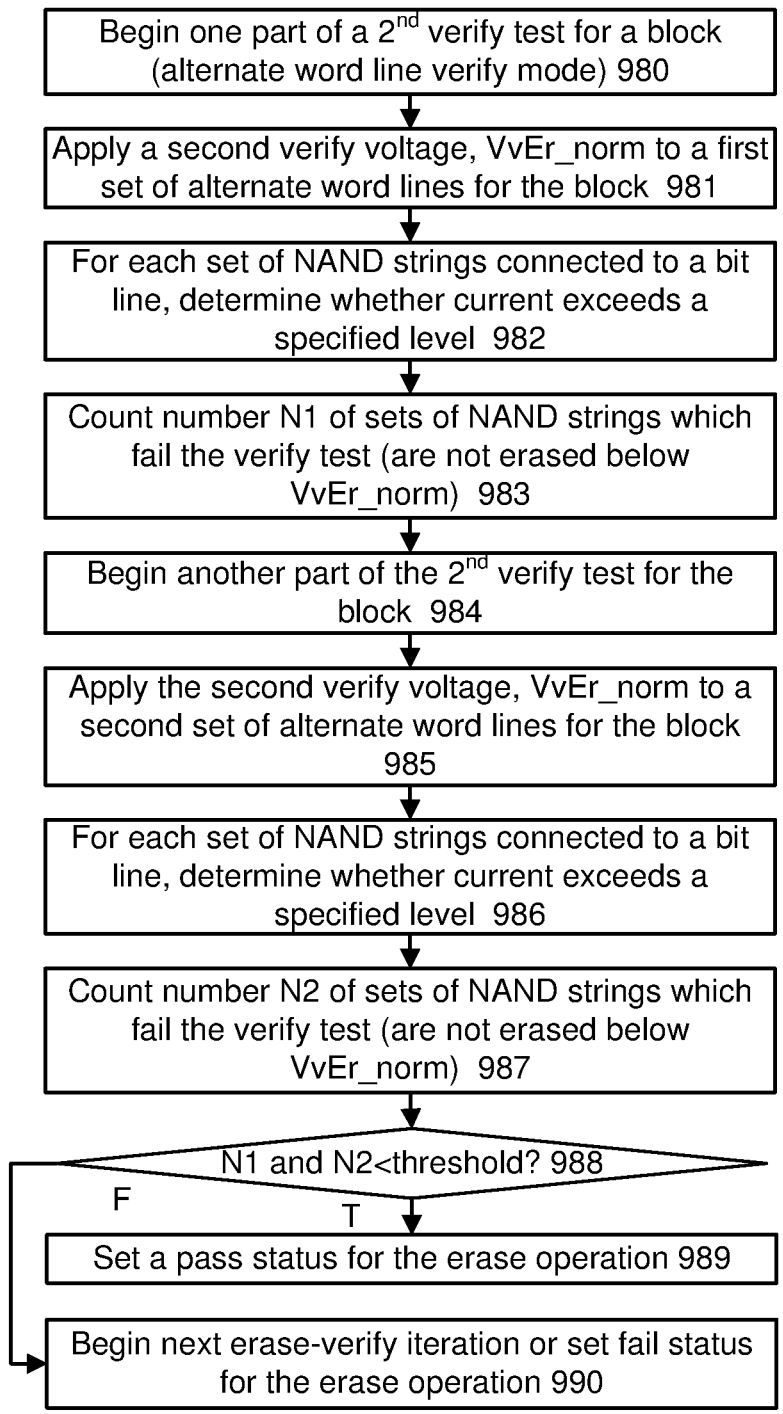
FIG. 9H depicts a flowchart of a second verify test for a block in an alternate word line verify mode, consistent with FIGS. 9A, 9C, 9F and 9G, where the second verify test is performed for both the first and second sets of alternate word lines.

FIG. 9H depicts a flowchart of a second verify test for a block in an alternate word line verify mode, consistent with FIGS. 9A, 9C, 9F and 9G, where the second verify test is performed for both the first and second sets of alternate word lines. Step 980 begins one (a first) part of a second verify test for a block using the alternate word line verify mode. Step 981 includes applying a second verify voltage, VvEr_norm, to a first set of alternate word lines for the block. Step 982 includes, for each set of NAND strings connected to a bit line, determining whether the current exceeds a specified level. Step 983 includes counting a number N1 of sets of NAND strings which fail the verify test, e.g., are not erased below VvEr_norm. Step 984 begins another (second) part of the second verify test for the block. Step 985 includes applying the second verify voltage, VvEr_norm, to a second set of alternate word lines for the block. Step 986 includes, for each set of NAND strings connected to a bit line, determining whether the current exceeds a specified level. Step 987 includes counting a number N2 of sets of NAND strings which fail the verify test, e.g., are not erased below VvEr_norm. A decision step 988 determines whether N1 and N2 are both below a threshold. Alternatively, the decision step 988 could determine whether N1 or N2 is below a threshold. If the decision step 988 is false, step 990 is reached. In this case, the block is not yet uniformly erased. If the decision step 988 is true, step 989 sets a pass status for the erase operation (and for the second verify test). In this case, the block is uniformly erased.

The approach depicted performs the second verify test for both the first and second set of alternate word lines. In another approach, analogous to FIG. 9F, the second verify test for the second set of alternate word lines could be omitted to save time if the second verify test is not passed by the first set of alternate word lines after step 983.

FIG. 10 depicts a table of commands consistent with FIG. 9B. 100-107 denote input/output bytes. These are bytes which can be transmitted from the control circuitry 110 to the controller 122, for example, to report results of the verify tests. 100 denotes a pass or fail status of erase-verify tests of an erase operation for a chip. Generally, blocks in multiple planes can be erased concurrently. If any of the blocks fails to successfully complete the erase operation, a status return byte is set to 1 to denote a fail status. If all blocks successfully complete the erase operation, a status return byte is set to 0 to denote a pass status.

IO1 denotes a pass or fail status of erase-verify tests of an erase operation for a block in a plane 0 (see, e.g., P0 in FIG. 4). IO2 denotes a pass or fail status of erase-verify tests of an erase operation for a block in a plane 1 (see, e.g., P1 in FIG. 4). In both cases, a status return byte is set to 0 or 1 to denote a pass or fail status, respectively.

The statuses of IO0-IO2 are separate from the slow-erase detection status.

IO3 and IO4 denote a pass or fail status of the slow erase detection process for a block in plane 0 or plane 1, respectively. A status return byte is set to 0 or 1 to denote a pass (normal erase speed) or fail (slow erase speed) status, respectively.

IO5 denotes a true busy status as busy or ready based on a value of 0 or 1, respectively. This indicates whether the chip is busy and cannot accept commands, or ready to accept commands.

IO6 and IO7 have a value of 0 and are not used in this example.

In one approach, a control circuit is configured to report a pass/fail result of whether a block passes a first verify test, e.g., using IO3 or IO4. The control circuit is also configured to report a pass/fail result of whether the block passes the second verify test within a maximum allowable number of erase-verify iterations, e.g., using IO1 or IO2.

The control circuit can also be configured to report a fail result for the erase operation when the block fails the first verify test and passes the second verify test within a maximum allowable number of erase-verify iterations.

In FIG. 11A-14, the vertical direction denotes voltage and the horizontal direction denotes time. Three erase-verify iterations EV1-EV3 are depicted as an example. The erase operation is completed after EV3 in these examples. However, in other examples, additional erase-verify iterations, not shown, could be performed. EV1-EV3 are an example of one or more successive erase-verify iterations. In FIGS. 11A and 12-14, the slow erase detection is performed in the initial (first) erase-verify iteration. In FIG. 11B, the slow erase detection is performed in the second erase-verify iteration.

Figure 11A:
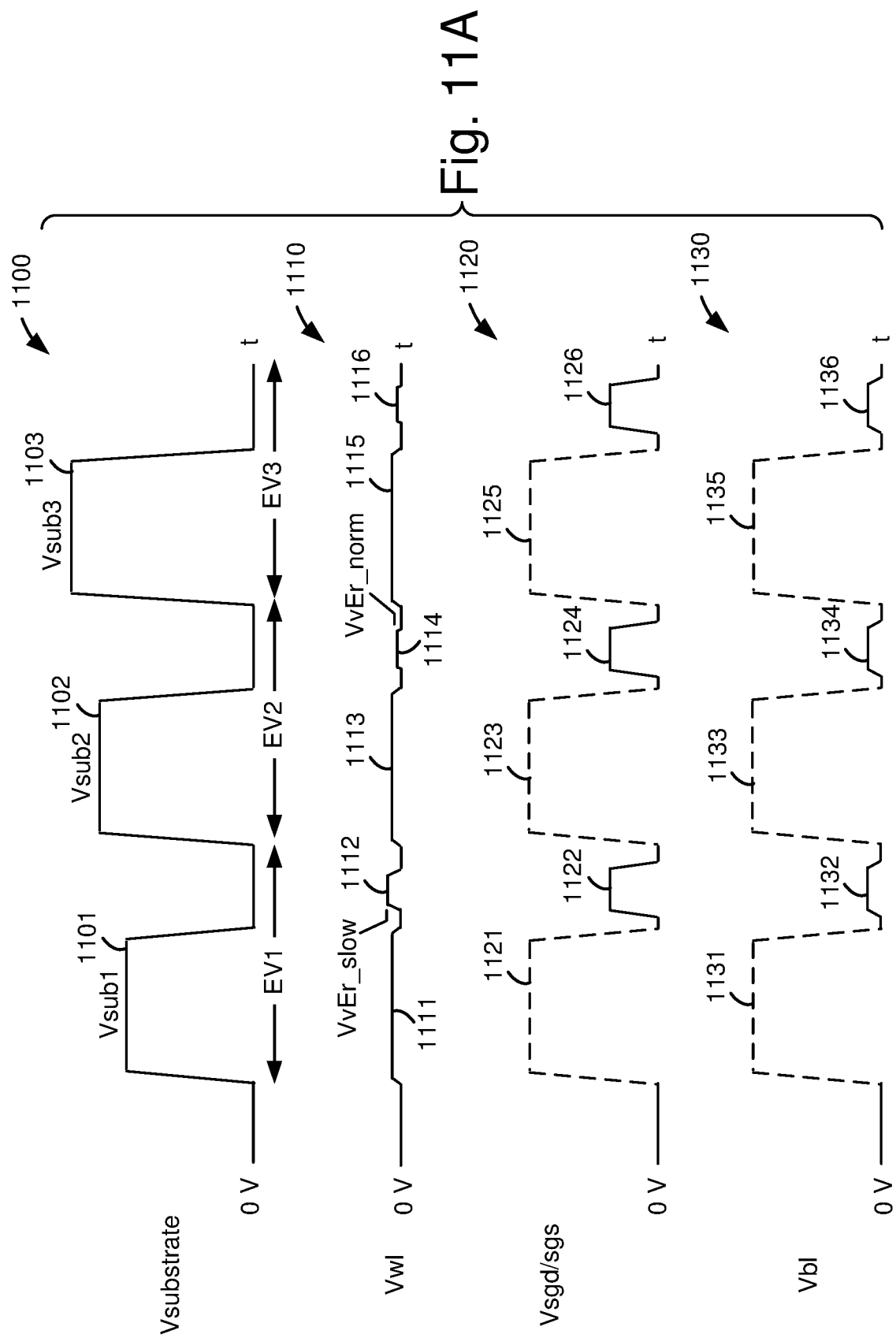
FIG. 11A depicts example voltage signals in an erase operation, consistent with FIGS. 8B, 9A and 9C-9E, where an all word line verify mode is used, a first verify test is performed in an initial erase-verify iteration EV1, and a second verify test is performed in the remaining erase-verify iterations EV2 and EV3.

FIG. 11A depicts example voltage signals in an erase operation, consistent with FIGS. 8B, 9A and 9C-9E, where an all word line verify mode is used, a first verify test is performed in an initial erase-verify iteration EV1, and a second verify test is performed in the remaining erase-verify iterations EV2 and EV3. As mentioned, when it is unlikely for the block to be fully erased after a single erase pulse, time savings can be achieved by performing the first verify test for the slow erase detection, but not the second verify test for the erase completion detection, in the initial erase-verify iteration. This is an example of performing the first verify test in a specified erase-verify iteration which is the initial erase-verify iteration.

A voltage signal 1100 represents Vsubstrate, a voltage applied to a substrate. First-third erase pulses 1101-1103 with magnitudes of Vsub1-Vsub3, respectively, are depicted in EV1-EV3, respectively. Each erase pulse charges up the channels of the NAND strings in a block. The erase pulses may have a starting magnitude of, e.g., 15 V, and increase with each erase-verify iteration.

A voltage signal 1110 represents a voltage applied to each of the data word lines of a block. The voltage can be a small positive voltage such as 0.5 V, for example, as represented by plots 1111, 1113 and 1115 during the erase pulses. The voltage signal also includes a first verify voltage, VvEr_slow, during EV1 as represented by the plot 1112, and a second verify voltage, VvEr_norm, of EV2 and EV3 as represented by the plots 1114 and 1116, respectively.

A voltage signal 1120 represents a voltage Vsgd/sgs applied to the SGD and SGS transistors of a block. In one approach, this voltage is floated, as denoted by the dashed lines 1121, 1123 and 1125 in EV1-EV3, respectively, during the application of the erase pulse. The voltage may be coupled up to a level such as 12 V as the channel voltage increases. During the verify tests, these transistors are driven to a pass voltage such as 5 V to provide them in a strongly conductive state to allow sensing to occur, as denoted by the plots 1122, 1124 and 1126 in EV1-EV3, respectively.

A voltage signal 1130 represents a bit line voltage, Vbl, which can be floated, as denoted by the dashed lines 1131, 1133 and 1135 in EV1-EV3, respectively, during the application of the erase pulse. Vbl may also be coupled up as the channel voltage increases. During the verify tests, Vbl is driven to a level such as 0.5 V to allow a current to flow in the NAND strings, as denoted by the plots 1132, 1134 and 1136 in EV1-EV3, respectively.

For the option to charge up the channels using GIDL, the SGD and/or SGS transistors can be driven with a positive voltage such as 8 V while an erase pulse is applied to the bit lines and/or substrate.

FIG. 11B depicts example voltage signals in an erase operation, consistent with FIGS. 8C, 9A and 9C-9E, where an all word line verify mode is used, a first verify test is performed in a second erase-verify iteration EV2, and a second verify test is performed in each of the erase-verify iterations EV1-EV3. This is an example of performing the first verify test in a specified erase-verify iteration other than the initial erase-verify iteration. In particular, the specified erase-verify iteration is the second erase-verify iteration. An assumption is that the erase operation is not completed before the specified erase-verify iteration. The erase operation could be completed in, or after, the specified erase-verify iteration.

Generally, the number of erase-verify iteration needed to complete an erase operation can be known ahead of time from testing or other data. The specified erase-verify iteration, in which a slow erasing block is detected, can be set to ensure the detection is performed before the erase operation is completed. In some cases, it is optimal for the specified erase-verify iteration to be the initial erase-verify iteration, as variations in the upper tail Vth between slow and normal erasing blocks may be clearest at this time.

A voltage signal 1150 represents Vsubstrate. First-third erase pulses 1151-1153 with magnitudes of Vsub1-Vsub3, respectively, are depicted in EV1-EV3, respectively.

A voltage signal 1160 represents a voltage applied to each of the data word lines of a block. The voltage can be a small positive voltage such as 0.5 V, for example, as represented by plots 1161, 1163 and 1166 during the erase pulses. During EV1, the voltage signal includes a second verify voltage, VvEr_norm (plot 1161). During EV2, the voltage signal includes a first verify voltage, VvEr_slow (plot 1164) and a second verify voltage, VvEr_norm (plot 1165). During EV3, the voltage signal includes a second verify voltage, VvEr_norm (plot 1167).

A voltage signal 1170 represents a voltage Vsgd/sgs applied to the SGD and SGS transistors of a block. In one approach, this voltage is floated, as denoted by the dashed lines 1171, 1173 and 1175 in EV1-EV3, respectively, during the application of the erase pulse. During the verify tests, these transistors are driven to a pass voltage such as 5 V to provide them in a strongly conductive state to allow sensing to occur, as denoted by the plots 1172, 1174 and 1176 in EV1-EV3, respectively.

A voltage signal 1180 represents a bit line voltage, Vbl, which can be floated, as denoted by the dashed lines 1181, 1183 and 1185 in EV1-EV3, respectively, during the application of the erase pulse. During the verify tests, Vbl is driven to a level such as 0.5 V to allow a current to flow in the NAND strings, as denoted by the plots 1182, 1184 and 1186 in EV1-EV3, respectively.

FIG. 12 depicts example voltage signals in an erase operation, consistent with FIGS. 9A and 9C-9E, where an all word line verify mode is used, first and second verify tests are performed in EV1, and the second verify test is performed in EV2 and EV3. When the block may be fully erased after a single erase pulse, the second verify test can be performed in addition to the first verify test in the initial erase-verify iteration to ensure that the completion of the erase operation is detected and over-erase does not occur. The duration of EV1 is therefore increased compared to FIG. 11A.

A voltage signal 1200 represents Vsubstrate. First-third erase pulses 1201-1203 with magnitudes of Vsub1-Vsub3, respectively, are depicted in EV1-EV3, respectively.

A voltage signal 1210 represents a voltage applied to each of the data word lines of a block. The voltage can be a small positive voltage such as 0.5 V, for example, as represented by plots 1211, 1214 and 1216 during the erase pulses. The voltage signal also includes a first verify voltage, VvEr_slow, and a second verify voltage, VvEr_norm during EV1 as represented by the plots 1212 and 1213, respectively. The second verify voltage, VvEr_norm, is used in EV2 and EV3 as represented by the plots 1215 and 1217, respectively.

A voltage signal 1220 represents Vsgd/sgs. In one approach, this voltage is floated, as denoted by the dashed lines 1221, 1223 and 1225 in EV1-EV3, respectively, during the application of the erase pulse. During the verify tests, these transistors are driven at the pass voltage as denoted by the plots 1222, 1224 and 1226 in EV1-EV3, respectively.

A voltage signal 1230 represents Vbl, which can be floated, as denoted by the dashed lines 1231, 1233 and 1235 in EV1-EV3, respectively, during the application of the erase pulse. During the verify tests, Vbl is driven to a level such as 0.5 V as denoted by the plots 1232, 1234 and 1236 in EV1-EV3, respectively.

EV1 could be modified by performing the verify test using VvEr_norm before the verify test using VvEr_slow.

Figure 13:
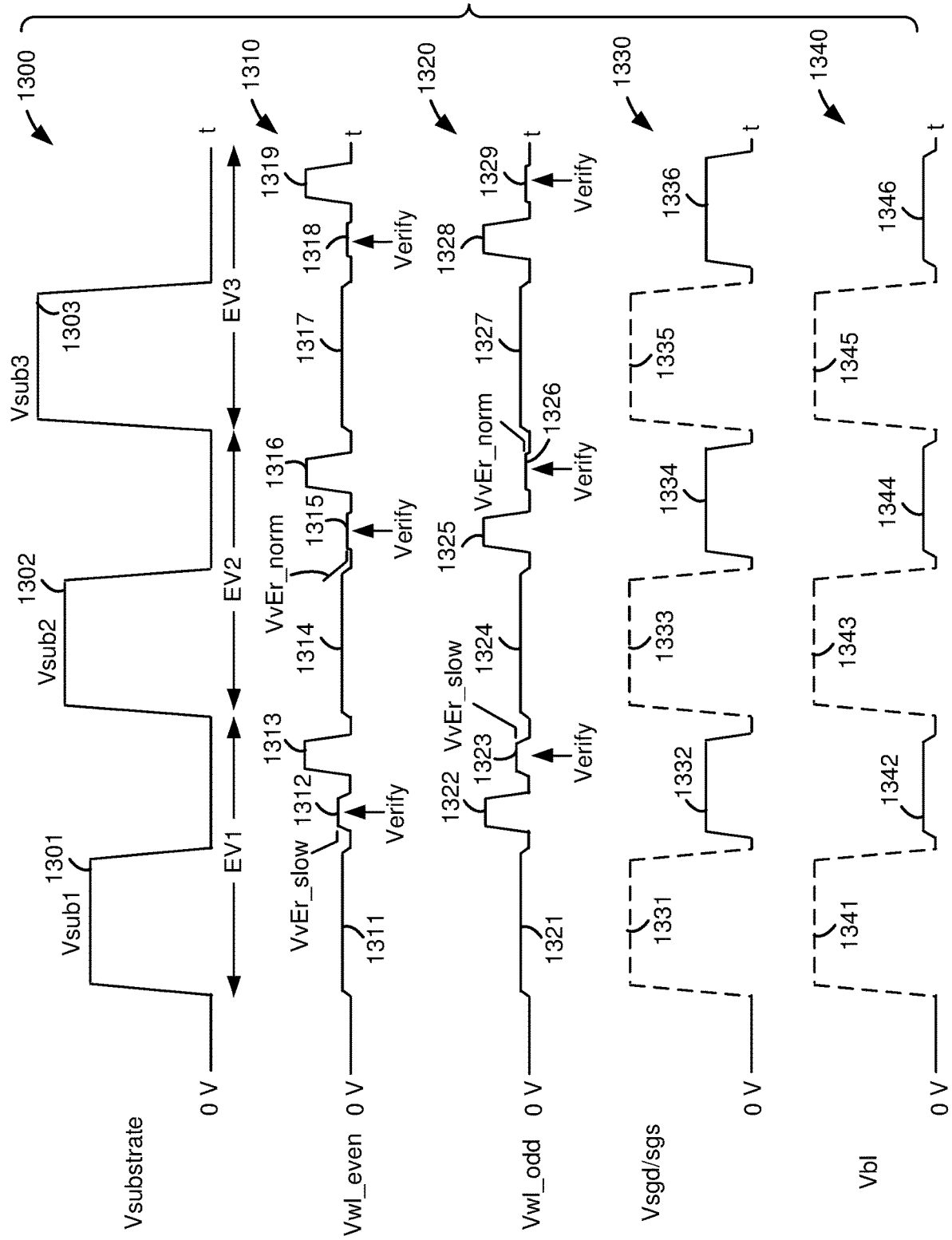
FIG. 13 depicts example voltage signals in an erase operation, consistent with FIGS. 9A, 9C, 9F and 9H, where an alternate word line verify mode is used, a first verify test is performed separately for even- and odd-numbered word lines in an initial erase-verify iteration EV1, and a second verify test is performed separately for even- and odd-numbered word lines in the remaining erase-verify iterations EV2 and EV3.

FIG. 13 depicts example voltage signals in an erase operation, consistent with FIGS. 9A, 9C, 9F and 9H, where an alternate word line verify mode is used, a first verify test is performed separately for even- and odd-numbered word lines in EV1, and a second verify test is performed separately for even- and odd-numbered word lines in EV2 and EV3. As mentioned, the first verify test tests for a slow-erasing block and the second verify test tests for the completion of an erase operation. An assumption in this example is that the erase operation will not be completed in the initial erase-verify iteration, so that the corresponding second verify test can be omitted in EV1 to save time. Although, the example could be modified to include testing of the block using the second verify test in EV1.

A voltage signal 1300 represents Vsubstrate. First-third erase pulses 1301-1303 with magnitudes of Vsub1-Vsub3, respectively, are depicted in EV1-EV3, respectively.

A voltage signal 1310 represents a voltage Vwl_even applied to each of the even-numbered data word lines of a block. The voltage can be a small positive voltage such as 0.5 V, for example, as represented by plots 1311, 1314 and 1317 during the erase pulses. The voltage signal also includes a first verify voltage, VvEr_slow (plot 1312) and a pass voltage (plot 1313) during EV1. A verify test is performed for the memory cells connected to the even-numbered word lines during the plot 1312. At this time, a pass voltage (plot 1322) is applied to the odd-numbered word lines as Vwl_odd. Subsequently in EV1, Vwl_even is set to a pass voltage (plot 1313) while Vwl_odd is set to VvEr_slow (plot 1323) and a verify test is performed for the memory cells connected to the odd-numbered word lines.

A similar even-odd verify process is followed in EV2 except the verify voltage is VvEr_norm instead of VvEr_slow. A verify test is performed for the memory cells connected to the even-numbered word lines during the plot 1315, representing VvEr_norm. At this time, a pass voltage (plot 1325) is applied to the odd-numbered word lines. Subsequently in EV2, Vwl_even is set to a pass voltage (plot 1316) while Vwl_odd is set to VvEr_norm (plot 1326) and a verify test is performed for the memory cells connected to the odd-numbered word lines.

In EV3, a verify test is performed for the memory cells connected to the even-numbered word lines during the plot 1318, representing VvEr_norm. At this time, a pass voltage (plot 1328) is applied to the odd-numbered word lines. Subsequently in EV3, Vwl_even is set to a pass voltage (plot 1319) while Vwl_odd is set to VvEr_norm (plot 1329) and a verify test is performed for the memory cells connected to the odd-numbered word lines.

A voltage signal 1330 represents Vsgd/sgs. In one approach, this voltage is floated, as denoted by the dashed lines 1331, 1333 and 1335 in EV1-EV3, respectively, during the application of the erase pulse. During the verify tests, these transistors are driven at the pass voltage as denoted by the plots 1332, 1334 and 1336 in EV1-EV3, respectively.

A voltage signal 1340 represents Vbl, which can be floated, as denoted by the dashed lines 1341, 1343 and 1345 in EV1-EV3, respectively, during the application of the erase pulse. During the verify tests, Vbl is driven to a level such as 0.5 V as denoted by the plots 1342, 1344 and 1346 in EV1-EV3, respectively.

EV1 could be modified by performing the verify test using VvEr_slow for the odd-numbered word lines before the even-numbered word lines. EV2 and EV3 could be modified by performing the verify test using VvEr_norm for the odd-numbered word lines before the even-numbered word lines.

FIG. 14 depicts example voltage signals in an erase operation, consistent with FIGS. 9A, 9C, 9F, 9G and 9H, where an alternate word line verify mode is used, a first verify test is performed for even-numbered word lines but not odd-numbered word lines in EV1, and a second verify test is performed separately for even- and odd-numbered word lines in EV2 and EV3.

In this case, the first verify test is limited to testing the even-numbered word lines. One scenario is consistent with FIG. 9F where step 964 is false. In this scenario, the number of sets of NAND strings which fail the first verify test is not less than a threshold, and a fail status is set for the first verify test. Testing of the odd-numbered word lines with the first verify voltage can be omitted to save time. An alternative to this scenario is when a fail status is set for the first verify test as applied to odd-numbered word lines, where testing of the even-numbered word lines with the first verify voltage can be omitted.

Another scenario is consistent with FIG. 9G, where the first verify test is limited to testing the even-numbered word lines or the odd-numbered word lines, but not both.

An assumption in this example is that the erase operation will not be completed in the initial erase-verify iteration, so that the corresponding second verify test can be omitted in EV1. Although, the example could be modified to include testing of the block using the second verify test in EV1.

A first time period tp1 is the duration of the first verify test for the even-numbered word lines and a second time period tp2>tp1 is the duration of the second verify test for the even-numbered and odd-numbered word lines. The difference between these time periods, tp2−tp1, denotes a time savings.

In one approach, a control circuit is configured to use the first time period tp1 to perform the first verify test and to use the second time period tp2, greater than the first time period, to perform the second verify test. Further, to perform the first verify test in the first time period, the control circuit is configured to sense currents in the NAND strings while applying a first verify voltage to a first set of alternate word lines (e.g., even-numbered word lines) but not a second set of alternate word lines (e.g., odd-numbered word lines) of a set of word lines. To perform the second verify test in the second time period, the control circuit is configured to sense currents in the NAND strings while applying a second verify voltage, lower than the first verify voltage, to the first set of alternate word lines (e.g., even-numbered word lines) of the set of word lines and to sense currents in the NAND strings while separately applying the second verify voltage to the second set of alternate word lines (e.g., odd-numbered word lines) of the set of word lines. In another approach, the first set of alternate word lines are the odd-numbered word lines and the second set of alternate word lines are the even-numbered word lines.

A voltage signal 1400 represents Vsubstrate. First-third erase pulses 1401-1403 with magnitudes of Vsub1-Vsub3, respectively, are depicted in EV1-EV3, respectively.

A voltage signal 1410 represents a voltage Vwl_even applied to each of the even-numbered data word lines of a block. The voltage can be a small positive voltage such as 0.5 V, for example, as represented by plots 1411, 1413 and 1416 during the erase pulses. The voltage signal also includes a first verify voltage, VvEr_slow (plot 1412) during EV1. A verify test is performed for the memory cells connected to the even-numbered word lines, but not the odd-numbered word lines, in this example, during the plot 1412. The example could be reversed to perform the verify test for the memory cells connected to the odd-numbered word lines, but not the even-numbered word lines. At this time, a pass voltage (plot 1422) is applied to the odd-numbered word lines as Vwl_odd.

In EV2, the even-odd verification process begins for the second verify test. Vwl_odd is set to a pass voltage (plot 1424) while Vwl_even is set to VvEr_norm (plot 1414) and the second verify test is performed for the memory cells connected to the even-numbered word lines. Vwl_even is then set to a pass voltage (plot 1415) while Vwl_odd is set to VvEr_norm (plot 1425) and the second verify test is performed for the memory cells connected to the odd-numbered word lines.

In EV3, a verify test is performed for the memory cells connected to the even-numbered word lines during the plot 1417, representing VvEr_norm. At this time, a pass voltage (plot 1427) is applied to the odd-numbered word lines as Vwl_odd. Subsequently in EV3, Vwl_even is set to a pass voltage (plot 1418) while Vwl_odd is set to VvEr_norm (plot 1428) and a verify test is performed for the memory cells connected to the odd-numbered word lines.

A voltage signal 1430 represents Vsgd/sgs. In one approach, this voltage is floated, as denoted by the dashed lines 1431, 1433 and 1435 in EV1-EV3, respectively, during the application of the erase pulse. During the verify tests, these transistors are driven at the pass voltage as denoted by the plots 1432, 1434 and 1436 in EV1-EV3, respectively.

A voltage signal 1440 represents Vbl, which can be floated, as denoted by the dashed lines 1441, 1443 and 1445 in EV1-EV3, respectively, during the application of the erase pulse. During the verify tests, Vbl is driven to a level such as 0.5 V as denoted by the plots 1442, 1444 and 1446 in EV1-EV3, respectively.

EV1 could be modified by performing the verify test using VvEr_slow for the odd-numbered word lines instead of the even-numbered word lines. EV2 and EV3 could be modified by performing the verify test using VvEr_norm for the odd-numbered word lines before the even-numbered word lines.

Accordingly, it can be see that in one implementation, an apparatus comprises: a block of memory cells, the memory cells are arranged in NAND strings and connected to a set of word lines, each NAND string comprising a channel; and a control circuit. The control circuit, to perform one or more successive erase-verify iterations for the block in an erase operation, is configured to charge up the channels of the NAND strings in each of the one or more successive erase-verify iterations, to perform a first verify test for the NAND strings to detect whether the block is slow-erasing and to perform a second verify test for the NAND strings to detect whether the erase operation is completed.

In another implementation, a method comprises: performing a specified erase-verify iteration of one or more successive erase-verify iterations for the block in an erase operation for a block of memory cells, the memory cells are arranged in NAND strings and connected to a set of word lines, each NAND string comprising a channel, the performing the initial erase-verify iteration comprises charging up the channels of the NAND strings and performing a first verify test comprising testing an erased level of the NAND strings relative to a first verify voltage; and during the one or more successive erase-verify iterations, charging up the channels of the NAND strings and performing a second verify test comprising testing an erased level of the NAND strings relative to a second verify voltage which is lower than the first verify voltage.

In another implementation, an apparatus comprises: a block of memory cells, the memory cells are arranged in NAND strings and connected to a set of word lines, each NAND string comprising a channel; and a control circuit. The control circuit is configured to receive a first command to determine whether the block is a slow-erasing block and to receive a second command to determine whether the block completes an erase operation within a maximum allowable number of erase-verify iterations.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a block of memory cells, the memory cells are arranged in NAND strings and connected to a set of word lines, each NAND string comprising a channel; and
a control circuit, the control circuit, to perform one or more successive erase-verify iterations including a specified erase-verify iteration and one or more remaining erase-verify iterations for the block in an erase operation, is configured to charge up the channels of the NAND strings in each of the one or more successive erase-verify iterations, to perform a first verify test of an erased level of the NAND strings relative to a first verify voltage to detect whether the block is slow-erasing and to perform a second verify test of an erased level of the NAND strings relative to a second verify voltage that is lower than the first verify voltage to detect whether the erase operation is completed, the specified erase-verify iteration including the first verify test and the second verify test and each of the one or more remaining erase-verify iterations including the second verify test but not the first verify test.

2. The apparatus of claim 1, wherein:
the specified erase-verify iteration is an initial erase-verify iteration and one or more remaining erase-verify iterations are subsequent erase-verify iterations that are performed subsequent to the initial erase-verify iteration.

3. The apparatus of claim 1, wherein:
the first verify test tests an erased level of the NAND strings relative to a first verify voltage and the second verify test tests an erased level of the NAND strings relative to a second verify voltage, lower than the first verify voltage.

4. The apparatus of claim 1, wherein:
the control circuit is configured to report a pass/fail result of whether the block passes the first verify test; and the control circuit is configured to report a pass/fail result of whether the block passes the second verify test within a maximum allowable number of erase-verify iterations.

5. The apparatus of claim 1, wherein:
the control circuit is configured to report a fail result for the erase operation when the block fails the first verify test and passes the second verify test within a maximum allowable number of erase-verify iterations.

6. The apparatus of claim 1, wherein:
the control circuit is configured to perform the first verify test in response to receipt of a prefix command which precedes a command to perform the second verify test.

7. The apparatus of claim 1, wherein:
the control circuit is configured to use a first time period to perform the first verify test and to use a second time period, greater than the first time period, to perform the second verify test.

8. The apparatus of claim 7, wherein:
to perform the first verify test in the first time period, the control circuit is configured to sense currents in the NAND strings while applying a first verify voltage to a first set of alternate word lines but not a second set of alternate word lines of the set of word lines; and
to perform the second verify test in the second time period, the control circuit is configured to sense currents in the NAND strings while applying a second verify voltage, lower than the first verify voltage, to the first set of alternate word lines of the set of word lines and to sense currents in the NAND strings while separately applying the second verify voltage to the second set of alternate word lines of the set of word lines.

9. The apparatus of claim 1, wherein:
the first verify test comprises one part in which the control circuit is configured to sense currents in the NAND strings while applying a first verify voltage to a first set of alternate word lines of the set of word lines; and
the control circuit is configured to report that the block is a slow-erasing block if the block fails the one part of the first verify test.

10. The apparatus of claim 9, wherein:
if the block passes the one part of the first verify test, the first verify test comprises another part in which the control circuit is configured to sense currents in the NAND strings while applying the first verify voltage to a second set of alternate word lines of the set of word lines;
the control circuit is configured to report that the block is a slow-erasing block if the block passes the one part of the first verify test and fails the another part of the first verify test; and
the control circuit is configured to report that the block is not a slow-erasing block if the block passes the one part of the first verify test and the another part of the first verify test.

11. A method, comprising:
performing a specified erase-verify iteration of one or more successive erase-verify iterations for the block in an erase operation for a block of memory cells, the memory cells are arranged in NAND strings and connected to a set of word lines, each NAND string comprising a channel, the performing the specified erase-verify iteration comprises charging up the channels of the NAND strings and performing a first verify test comprising testing an erased level of the NAND strings relative to a first verify voltage to determine whether the block is slow-erasing and a second verify test comprising testing an erased level of the NAND strings relative to a second verify voltage which is lower than the first verify voltage to detect whether the erase operation is completed; and
during the one or more successive erase-verify iterations, charging up the channels of the NAND strings and performing the second verify test but not the first verify test.

12. The method of claim 11, further comprising:
reporting a pass/fail result of whether the block passes the first verify test in response to a first status return command; and
reporting a pass/fail result of whether the block passes the second verify test within a maximum allowable number of erase-verify iterations in response to a second status return command.

13. The method of claim 11, wherein:
the performing of the first verify test is responsive to a prefix command; and
the performing of the second verify test is responsive to a command which follows the prefix command.

14. The method of claim 11, wherein:
the first verify test is performed in a first time period; and
the second verify test is performed in a second time period which is greater than the first time period.

15. An apparatus, comprising:
a block of memory cells, the memory cells are arranged in NAND strings and connected to a set of word lines, each NAND string comprising a channel; and
a control circuit, the control circuit is configured to sense currents in the NAND strings while applying a first verify voltage to a first set of alternate word lines but not a second set of alternate word lines of the set of word lines in response to receipt of a first command to determine whether the block is a slow-erasing block and to sense currents in the NAND strings while applying a second verify voltage, lower than the first verify voltage, to the first set of alternate word lines of the set of word lines and to sense currents in the NAND strings while separately applying the second verify voltage to the second set of alternate word lines of the set of word lines in response to receipt of a second command to determine whether the block completes an erase operation within a maximum allowable number of erase-verify iterations.

16. The apparatus of claim 15, wherein:
the control circuit is configured to determine whether the block is a slow-erasing block in a specified erase-verify iteration of a plurality of erase-verify iterations of an erase operation.

17. The apparatus of claim 15, wherein:
to determine whether the block is a slow-erasing block, the control circuit is configured to perform a first verify test which tests an erased level of the NAND strings relative to the first verify voltage in a first erase-verify iteration; and
to determine whether the block completes the erase operation within the maximum allowable number of erase-verify iterations, the control circuit is configured to perform a second verify test which tests an erased level of the NAND strings relative to the second verify voltage in at least a second erase-verify iteration.

18. The apparatus of claim 17, wherein:
the control circuit is configured to perform the second verify test but not the first verify test in one or more erase-verify iterations of the erase operation which follow an initial erase-verify iteration.

19. The apparatus of claim 17, wherein:
the control circuit is configured to perform the first verify test and the second verify test in a specified erase-verify iteration of a plurality of erase-verify iterations of an erase operation and to perform the second verify test but not the first verify test in one or more remaining erase-verify iterations of the erase operation.

20. The apparatus of claim 15 wherein the first command is a prefix command and the second command follows the prefix command.

* * * * *